United States Patent

Plesko

[11] Patent Number: 5,831,261
[45] Date of Patent: Nov. 3, 1998

[54] REFLECTIVE SWITCH

[75] Inventor: George A. Plesko, Media, Pa.

[73] Assignee: Geo Labs, Inc., Media, Pa.

[21] Appl. No.: 854,810

[22] Filed: May 12, 1997

Related U.S. Application Data

[60] Continuation-in-part of Ser. No. 612,364, Mar. 7, 1996, Pat. No. 5,778,133, which is a division of Ser. No. 235,493, Apr. 29, 1994, Pat. No. 5,519,198, which is a division of Ser. No. 776,663, Oct. 15, 1991, Pat. No. 5,371,347.

[51] Int. Cl.$^6$ ....................................................... G09G 1/00
[52] U.S. Cl. .......................... 250/221; 250/221.1; 385/18; 235/467
[58] Field of Search .................................. 385/18, 16, 17, 385/19, 146, 147, 901; 250/221, 221.1, 229, 227.16, 227.22, 235, 236; 235/467, 470, 472, 462

[56] References Cited

U.S. PATENT DOCUMENTS 5,371,347  12/1994  Plesko ........................................ 235/467
5,519,198  5/1996  Plesko ........................................ 235/462

Primary Examiner—Phan T. H. Palmer
Attorney, Agent, or Firm—Reed Smith Shaw & McClay LLP

[57] ABSTRACT

A non-mechanical switch for actuating a light beam scanning device disposed within a device housing. The device housing has a first area for emitting a scanning light beam from the device. The switch is formed of a light source and a light detector disposed within the device housing, the light source emits light through a second area on the device housing. The light detector is adapted to receive light emitted from the light source and reflected back through the second area toward the light detector by an object disposed outside of the device housing. The light detector has an output signal that is coupled by electronic circuitry to a light beam scanner within the light beam scanning device. The electronic circuitry is adapted to selectively actuate the light beam scanning device in response to the output signal from the light detector. The first area on the device housing for emitting the scanning light beam from the device is separate from the second area on the device housing.

57 Claims, 17 Drawing Sheets

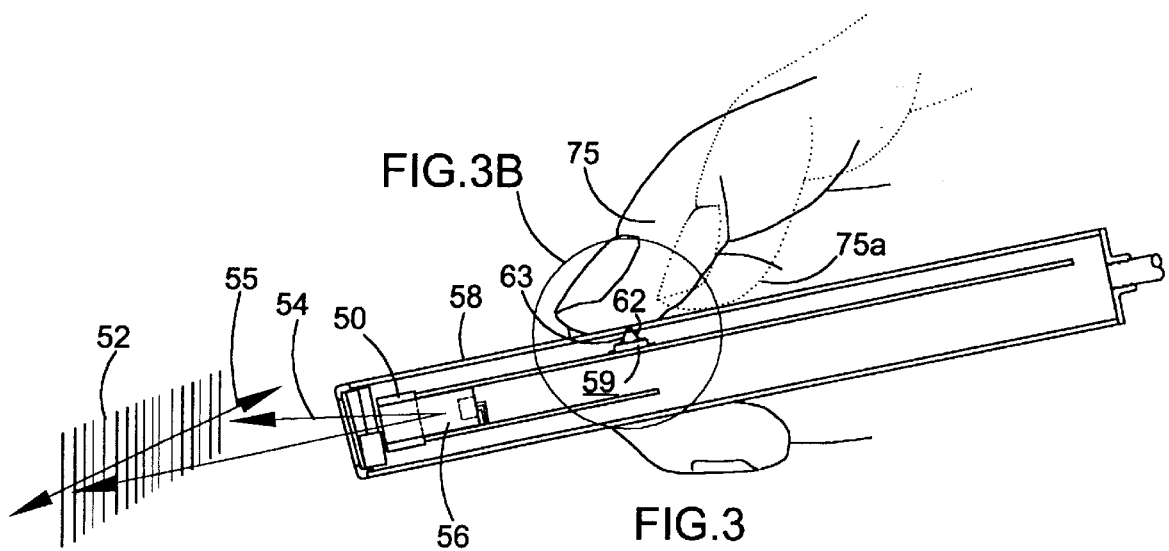
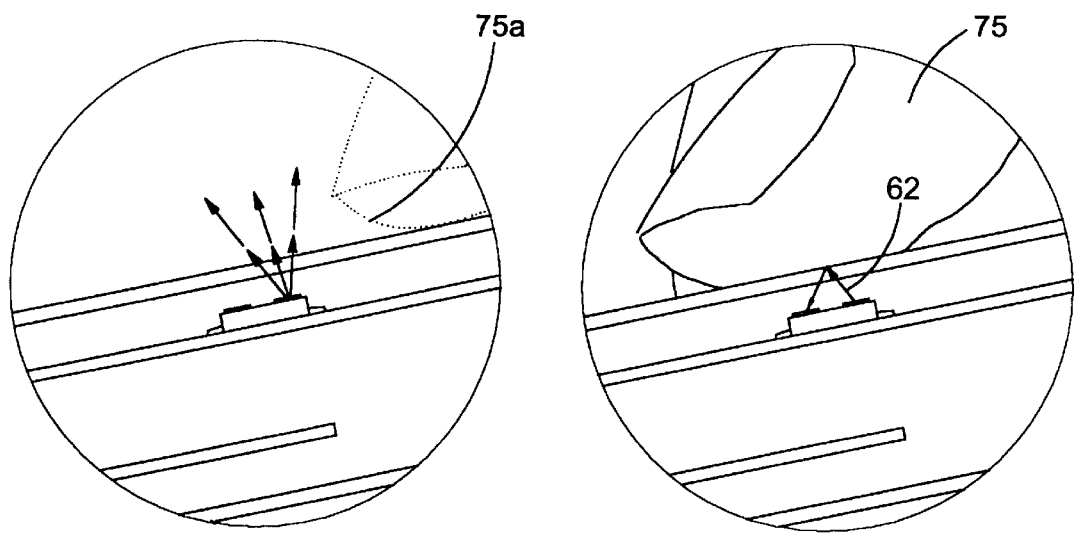

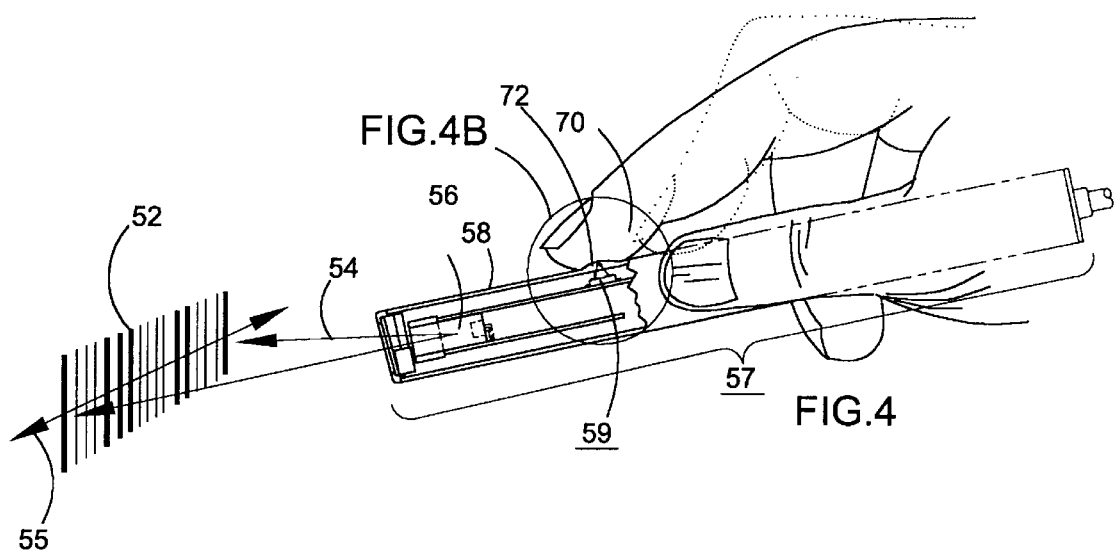
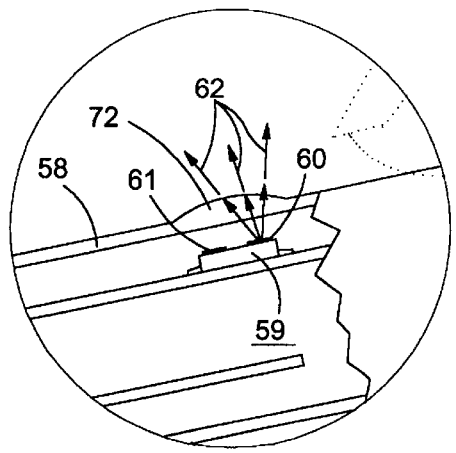
FIG.4A
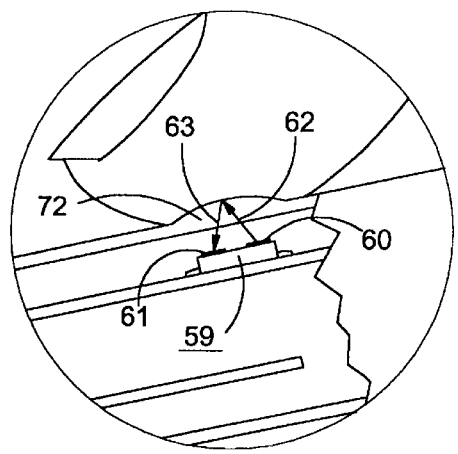
FIG.4B

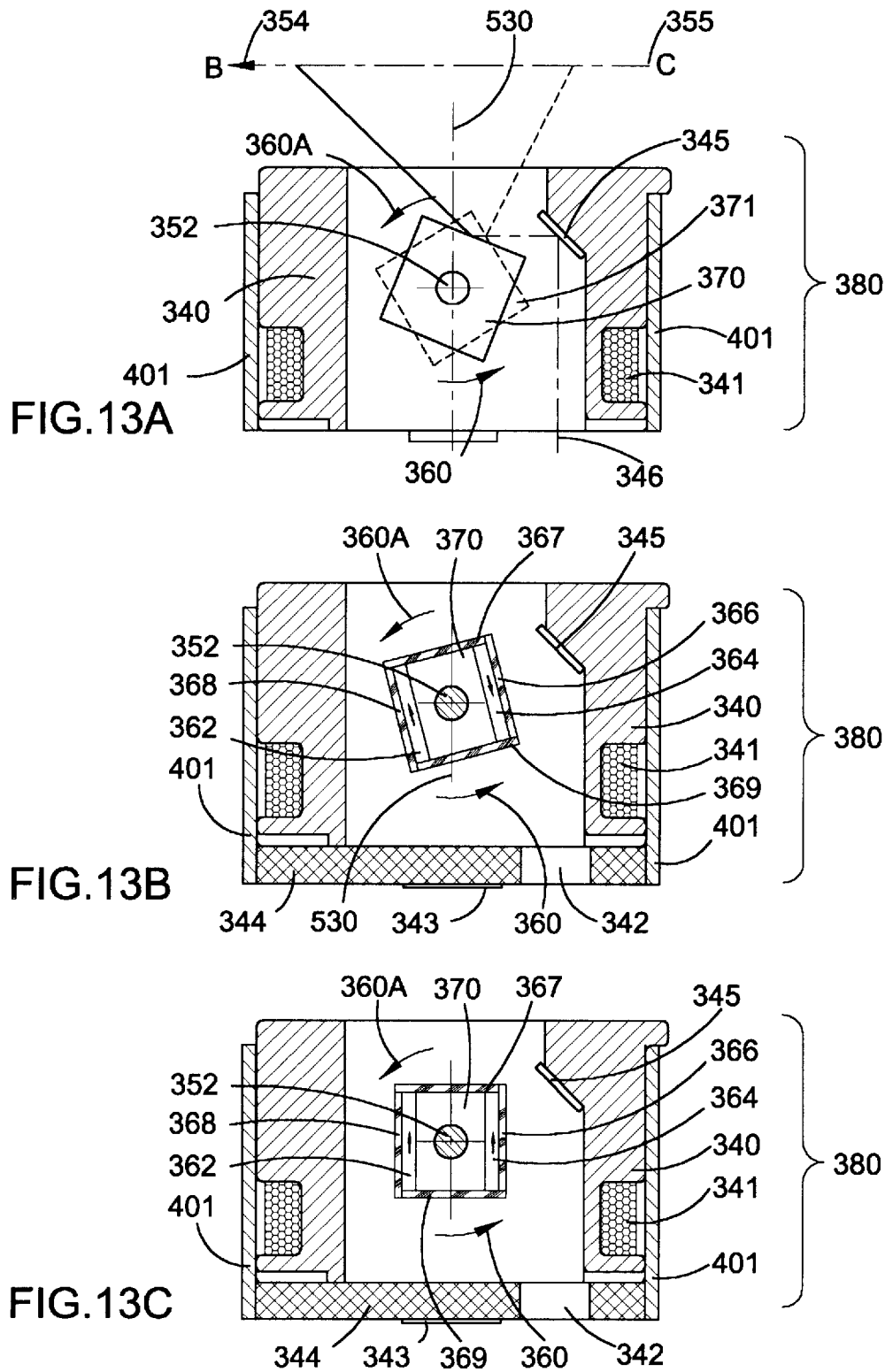

REFLECTIVE SWITCH

The present application is a continuation-in-part of U.S. application Ser. No. 08/612,364, filed Mar. 7, 1996, now U.S. Pat. No. 5,778,133 which is a divisional of U.S. application Ser. No. 08/235,493, filed Apr. 29, 1994 (now U.S. Pat. No. 5,519,198), which is a divisional of U.S. application Ser. No. 07/776,663, filed Oct. 15, 1991 (now U.S. Pat. No. 5,371,347).

FIELD OF THE INVENTION

The present invention relates generally to optical scanning and reading equipment and, in particular, to wearable and ergonomic systems for implementing laser-based optical scanning systems.

BACKGROUND

The commercial success of bar code reading equipment utilizing portable beam scanning equipment is well known. As the field continues to advance, users of portable data collection equipment demand ever smaller scan systems with more computerized features and greater convenience of operation. Productivity in the portable data collection industry is dependent on ease of operation of light weight equipment. Acceptance of such equipment by those who operate it on a daily basis depends upon the ergonomic features of scanning devices and terminals.

In some environments where users may be required to climb ladders to capture data, "hands free" and/or wearable scanning equipment is desirable and can lend to the safety of the operator if properly designed. Therefore, the way in which scanners are turned on and off is a significant ergonomic consideration in the design of portable scanning equipment.

The present market place continues to demand scanners which are smaller, lighter, lower cost, lower power with higher functionality, and now even wearable data collection systems are coming into demand.

As will be shown, the present invention advances the state of scanning art by providing fatigue reducing, novel actuation methods, low mass systems and wearability features which greatly reduce operator fatigue produced by mechanical switch mechanisms, heavy equipment, encumbering cables and the like.

Numerous hand holdable portable data collection systems for reading bar code have been successful in the market. These generally fall into two classes: (i) those which scan and read a bar code, then send the data to external data processing systems, (ii) and those in which scanners are integrated within data processing terminals.

Among the hand holdable portable scanners, gun-shaped scanners have been popular, such as the non-contact laser scanner described in U.S. Pat. No. 4,387,297. This scan system utilizes a mechanical trigger mechanism on the outside of the housing and is operated by squeezing the trigger with the index finger. This technique, however, can cause user fatigue. The trigger requires numerous parts to effect spring loaded lever action of an internal electromechanical switch. An opening in the housing is also necessary to allow for mechanical linkage of the external trigger to the switch inside the housing, thus rendering the housing difficult to seal against moisture or other contamination. Making such a scanner intrinsically safe in an explosive fume environment is also difficult due to the sealing problem.

U.S. Pat. No. 5,260,553 describes a hand holdable scanner with a non-scanning light source (i.e., a light source other than the beam scanning light source) which reflects off of a target (e.g., a bar code). The non-scanning light source works in conjunction with a separate special detector to ascertain target distance or presence. If the target is within scanning range, the scanner is then signaled to turn on. This scheme, although it does away with a certain amount of user fatigue, has been known to cause some user frustration because the target's ability to reflect the non-scanned light can influence the point at which the unit goes on rather than its true distance from a target. Also, considerable light must be continuously emitted to "see" distant targets, hence, precious battery power is consumed.

U.S. Pat. No. 4,639,606 discloses laser emission control circuitry for use in implementing hand-held bar code equipment operation. The laser is operated in a pulsed "find paper" mode until a reflected signal is obtained indicating the presence of a target in the search field, where upon scanning is automatically initiated. Since this system requires continuous use of a pulsed-laser beam to determine the presence of an object within the scan field, it consumes significant power to energize the laser. (Most commonly available solid state laser diodes require tens of milliamps and voltages in excess of 2 volts to operate.) Also, the control circuitry for solid state laser control is not simple, especially when several discrete power modes, including pulsed modes, are desired. This increases system bulk and cost.

Scanners with integrated terminals suffer from the same drawbacks as do the systems mentioned above. One prior art scan system such as the one illustrated in FIG. 7 is a wearable scan system. It works with an arm mounted terminal and has a cable attached between the scanner and the terminal. The scanner portion has a mechanical thumb operated switch lever similar to the trigger described in U.S. Pat. No. 4,387,297. The lever is clumsy, leads to operator fatigue and suffers from all the difficulties of gun style scanners. Removal of this finger mounted system is also inconvenient because of the cable. The finger mountable scan head is quite bulky and can lead to user discomfort due to the size and mass of the unit which carries all the internal parts of a complete scanner including light detection circuits.

In general, the portable prior art scan systems cited above suffer from size, power usage, and ergonomic difficulties.

SUMMARY OF THE INVENTION

The present invention is directed to non-mechanical switch for actuating a light beam scanning device disposed within a device housing. The device housing has a first area for emitting a scanning light beam from the device. The switch is formed of a light source and a light detector disposed within the device housing, the light source emits light through a second area on the device housing. The light detector is adapted to receive light emitted from the light source and reflected back through the second area toward the light detector by an object disposed outside of the device housing. The light detector has an output signal that is coupled by electronic circuitry to a light beam scanner within the light beam scanning device. The electronic circuitry is adapted to selectively actuate the light beam scanning device in response to the output signal from the light detector. The first area on the device housing for emitting the scanning light beam from the device is separate from the second area on the device housing.

In accordance with a further aspect, the present invention is directed to an apparatus for actuating a light beam scanning device disposed within a device housing. A strip of piezo material is coupled to the light beam scanning device. The strip of piezo material has first and second metalized sides coupled by electronic circuitry to a light beam scanner within the light beam scanning device. The electronic circuitry is adapted to selectively actuate the light beam scanning device in response to electrical signals from the strip of piezo material.

In accordance with a further aspect, the present invention is directed to an apparatus for scanning a target, the apparatus is formed from a light beam scan system disposed in a first housing and a remote terminal disposed in a second housing. The second housing is separate from the first housing. The light beam scan system includes an internal light source, an internal scan element, and an actuation switch. The internal scan element receives and redirects light from the internal light source to produce a scanning light beam for scanning the target. The remote terminal has a photoelectric light detector for receiving light from the scanning light beam reflected by the target toward the light detector and converting the reflected light into electric signals.

In accordance with yet a further aspect, the present invention is directed to a method for generating a non-oscillatory scanning light beam for scanning a target. A light beam is moved from a stationary equilibrium position to a first position at a first extreme end of a scan line, the scan line intersecting the target. Immediately after the light beam reaches the first extreme end of the scan line, the light beam is moved from the first extreme end of the scan line to a second extreme end of the scan line. Immediately after the light beam reaches the second extreme end of the scan line, the light beam is returned back to the stationary equilibrium position.

In accordance with a still further aspect, the present invention is directed to an apparatus for generating a scanning light beam, including a light source for producing a light beam traveling in an input beam direction, and a scan element formed from a frame and at least one mirror affixed to a rotor. The rotor is rotatably mounted to the frame, and the scan element has an opening for receiving the light beam traveling in the input beam direction. A drive circuit is provided for rotating the at least one mirror affixed to the rotor. The scan element produces an output light beam in an output beam direction which is generally the same as the input beam direction during rotation of the at least one mirror, and the output light beam scans about a scanner axis aligned along the output beam direction during rotation of the at least one mirror.

Several important features of the present invention should now be pointed out.

Use of the reflective switch described herein permits the housing of a scan system to be substantially sealed against contamination since no mechanical coupling is needed between the housing and the inside of the scan system.

The need to push or squeeze fatigue producing spring loaded switches as are common on prior art scanners is eliminated by the present invention. Furthermore, miss registration of the scan beam with respect to a target due to the application of force or impact from mechanical switching is eliminated in low mass scan equipment.

In low mass portable and especially in hand holdable housings such as wand style housings, card housings, pocket calculator size housings or finger mounted housings, the pressing or pushing of mechanical switches is replaced by more ergonomic methods. Only a simple slipping forward of an index finger, or sliding motion of a thumb or other digit is required by various embodiments of the present invention and has been found to be much easier and more efficient than actuating the mechanical detent type switches or triggers found in prior art scanners.

Assembly of the reflective object switch or acoustic switches described herein is easier and less expensive than assembly of bulky prior art trigger mechanisms which require numerous special parts including springs, levers, pivot mounting features, openings in the housing, mechanical switches, stops to prevent over travel or damage to the mechanical switch and the like. The non-mechanical switch of the present invention is simply soldered to the circuit board—preferably automatically machine populated and soldered. The whole scanner assembly is then simply closed or sealed in a housing.

The present invention also provides sealed housings for safe scanner operation in harsh environments or explosive environments.

The elimination of all the extra mechanical parts of the above mentioned prior art portable scanners increases product reliability of the inventive scanner.

Whereas prior art scanners generally require specialized grips such as the gun style triggers, the non-mechanical or reflective switches of the present invention are very versatile in that they may be activated by multiple methods described herein and as illustrated in FIGS. 1A, 1B, 2, 3, 5 and 9.

Various embodiments of the present invention minimize power required for scanning by accomplishing the scan with one single pulse. These and other advantages of the invention are disclosed in the drawings and descriptions that follow.

BRIEF DESCRIPTION OF THE DRAWINGS

FIG. 1A shows a magnified view of the reflective switch illustrated in FIG. 1. In FIG. 1A, the reflective switch is shown in a non-reflective state wherein a user's digit is not positioned above the switch. As shown in FIG. 1A, the reflective switch of the present invention needs no physical coupling to the inside of the scan system housing and lacks moving parts.

FIG. 1B is a further magnified view of the reflective switch illustrated in FIG. 1. In FIG. 1B, the reflective switch is shown in a reflective state wherein a user's digit is positioned above the switch. FIG. 1B illustrates how light is emitted from within the scanner housing and then reflected off of a user's digit to actuate the scan system of FIG. 1 in accordance with the present invention.

FIG. 2 illustrates how a user may operate the reflective switch of the present invention without physically contacting the scan system housing.

FIG. 3 illustrates a method for selectively actuating a scan system with a reflective switch, in accordance with a further alternative embodiment of the present invention. In the embodiment shown in FIG. 3, a user may actuate the scan system by sliding a thumb across the system housing.

FIG. 3A illustrates a magnified view of the reflective switch of FIG. 3. In FIG. 3A, the reflective switch is shown in a non-reflective state wherein the user's thumb is not positioned above the switch.

FIG. 3B illustrates a further magnified view of the reflective switch illustrated in FIG. 3. In FIG. 3B, the reflective switch is shown in a reflective-state wherein the user's thumb is positioned above the switch.

In FIG. 3C, the scan system shown has a data terminal and display incorporated therein.

FIG. 4 illustrates a method and system for selectively actuating a scan system with a reflective switch, in accordance with yet a still further alternative embodiment of the present invention. In the embodiment of FIG. 4, a user may slide a finger from one position to another over a raised bump on the scanner housing to change state of the reflective switch and thereby actuate the scanning system.

FIG. 4A illustrates a magnified view of the reflective switch of FIG. 4. In FIG. 4A, the reflective switch is shown in a non-reflective state.

FIG. 4B illustrates a magnified view of the reflective switch of FIG. 4. In FIG. 4B, the reflective switch is shown in a reflective state.

FIG. 5A illustrates the use of a reflective switch for actuation of the finger-mounted light beam scanner.

In FIGS. 5B and 5C, the light beam scanner includes an actuation switch formed from a strip of piezo electric film, in accordance with a further embodiment of the present invention. A user actuates the piezo electric switch by bending a finger between the positions shown in FIGS. 5B and 5C.

In FIG. 9A, the scan system shown has a data terminal and display incorporated therein.

FIG. 13A shows a miniature scan element small enough for finger mounting and capable of high speed rotating scanning, in accordance with a preferred embodiment of the present invention.

FIG. 13B illustrates how magnetic elements may be used with the device of FIG. 13A to enhance its starting properties, in accordance with a preferred embodiment of the present invention.

FIG. 13C illustrates alternate magnet orientations for the scan element of FIG. 13A.

DETAILED DESCRIPTION OF THE PREFERRED EMBODIMENTS

Non-Mechanical Scan Activator

Figure 1:
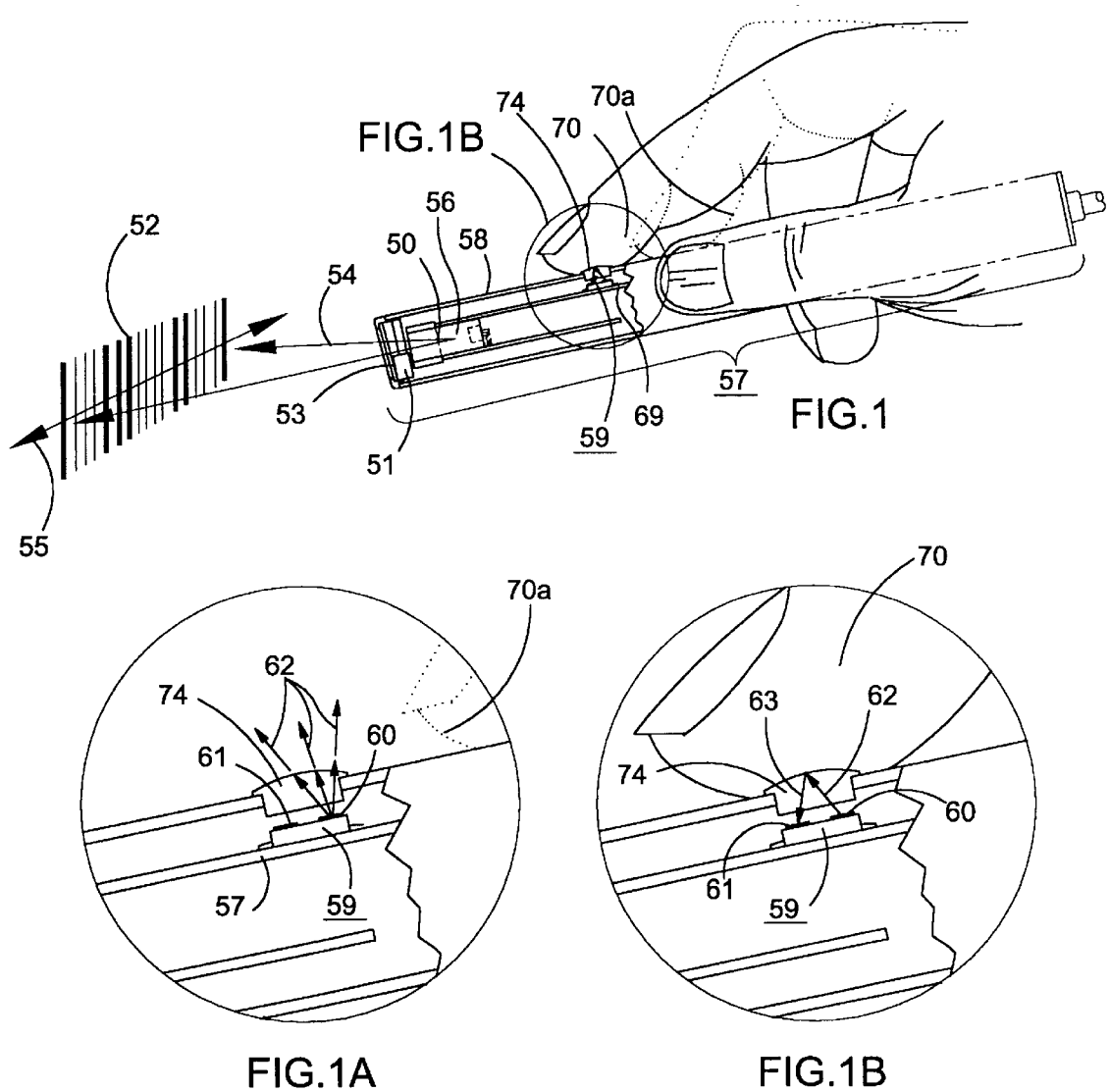
FIG. 1 illustrates a method and system for selectively actuating a scan system with a reflective switch, in accordance with a preferred embodiment of the present invention. Use of the reflective switch permits a user to comfortably grip and actuate the scan system in a virtually effortless manner by simply sliding the user's digit across the system housing.

Turning to FIG. 1, we see a hand holdable light beam scan system 57 which may be held in the manner of a pen or wand during use. Scan system 57 has a scan module 56 for scanning light beam 54 across target 52 in the direction of arrow 55. Light scanning beam 54, such as that which may be generated by a laser light source, emerges through the front of housing 58 from a scan module 56 enclosed within the housing 58. A portion of the light reflected from target 52 is detected by photo electric converter 51. Information from the target is thereafter converted into electronic signals suitable for computer processing. In FIG. 1, target 52 is a bar code pattern. (Hereafter the term target is defined as any target from which light may be used to extract information including a bar code target.)

Figure 2:
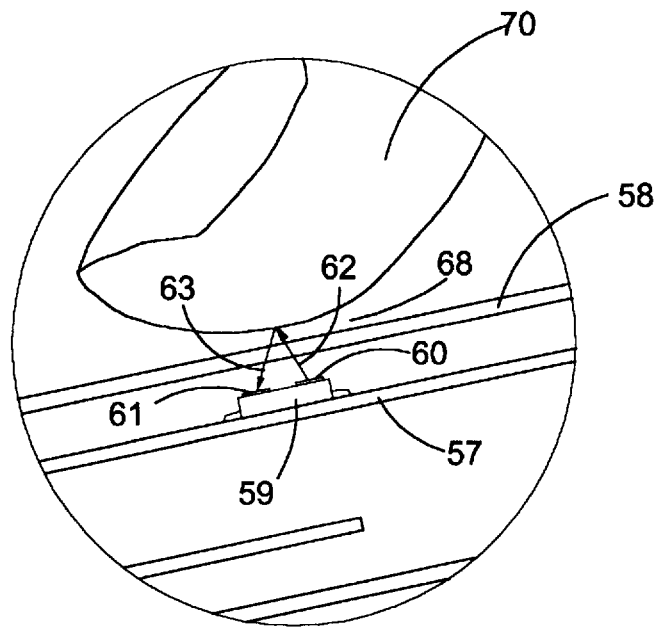
FIG. 2 illustrates a method for selectively actuating a scan system with a reflective switch, in accordance with an alternative preferred embodiment of the present invention. In particular.

In order to minimize fatigue, the user may turn the scan system 57 on or off as desired by using a digit 70 such as a finger by simply sliding digit 70 (shown also in a phantom view as digit 70a) above reflective switch element 59 attached to circuit board 69 within housing 58. No force or pressure need be applied by digit 70 to effect on/off actuation of reflective switch element 57. Thus, the scan system is easier to hold and operate than prior art scanners. In fact, reflective switch element 59 may be adapted so that actuation of the scan system 57 may be effected by bringing digit 70 within close proximity to reflective switch element 59 but without ever touching housing 58. This embodiment is illustrated in FIG. 2 which shows space 68 between digit 70 and housing 58.

As explained more fully below, reflective switch element 59 emits light 62 from an internal light source (e.g., LED 60) through the housing 58. The portion of the housing 58 through which light emitted from element 59 passes (e.g., the side of housing 58) is different from the portion of the housing through which light scanning beam 54 emerges (e.g., the front 53 of housing 58). When, as shown in FIG. 1A, an object (e.g., a user's digit) is not positioned above or proximate to reflective switch element 59, the light 62 emitted from the internal light source of element 59 is not reflected back to element 59 and scan system 57 is not actuated. However, when, a shown in FIG. 1B, an object such as a user's digit is positioned above or proximate to reflective switch element 59, a portion of the light 62 emitted by the light source in element 59 is reflected off of the object (e.g., digit) and back toward a light detector (e.g., a photodetector) within element 59. When sufficient reflected light 63 is received by the light detector in the reflective switch element 59, signal processing circuitry coupled to the output of the light detector functions to actuate (i.e., turn on) the scan system 57.

Reflective switch element 59 is preferably formed from a reflective object sensor such as surface mountable sensor Model EE-SY124 manufactured by Omron Electronics, Inc. Reflective switch element 59 thus preferably contains a light emitting diode (LED) 60 and a photo detector 61, although it will be understood by those skilled in the art that light sources other than LEDs and light detectors other than photo detectors may alternatively be used for implementing reflective switch element 59. Photo detector 61 is preferably a photo transistor but a photo resistor or photo diode could alternatively be used instead. Omron recommends sensor Model EE-SY124 for detecting paper in copy machines or the like and suggests that a non-amplified emitter follower circuit be coupled to the photo detector during operation of this particular device. However, it has been found that reflective switch element 59 can also be used in an amplified mode wherein the output of detector 61 is amplified in order to effectuate switching of scan system 57.

For portable applications where battery power conservation is important, current to the LED 60 is limited to a low RMS value and an amplified mode for photo detector 61 is preferred. The amplified light signal output by the photo transistor 61 is then used to electronically switch scan system 57 on only when needed. As will be shown later, additional enhancements may be added to further improve the function of the non-mechanical reflective switch 59 of the present invention.

Transparent And Sealable Housings

Some or all of housings 58, 91 and 200 of FIGS. 1, 2, 3, 4, 5 and 9 can be molded from plastic which is selectively transparent to the wavelength of light emitted by LED 60. Such plastic can be used to mold windows in the housing 58 above element 59, and can be made to attenuate or be opaque to wavelengths of light perceptible by human vision yet highly transmissive to the specific wavelength of light emitted by LED 60. Preferably the specific light emitted by LED 60 is infrared light.

If it is desired to make the housing 58 out of some other material which is truly opaque, such as metal, only a simple window or plug 74 which is transmissive to light from the reflective switch element 59 need be installed as shown in FIGS. 1, 1A, 1B, 3 and 9. This does not in any way reduce sealability of the housing nor does it add any moving parts. The window 74 may simply be pressed or glued into an appropriate hole in the housing 58 thereby sealing it easily since it does not physically move when operated. The sensor window can also be made as a raised structure 72 which is an integral part of the housing as seen in FIGS. 1, 4, 4A and 4B. Raised structure 72 aids the user in locating the active sensor location by touch without having to look for it. In a preferred embodiment the raised structure 72 is simply molded on a housing 58 from plastic which is opaque to or attenuates visible light but transparent to light emitted from reflective switch element 59. Window or plug 74 may also be formed of a raised structure as shown in FIG. 1. The raised structures allow the user, by sense of feel to know where to slide his/her finger to operate the scanning device.

Figure 8:
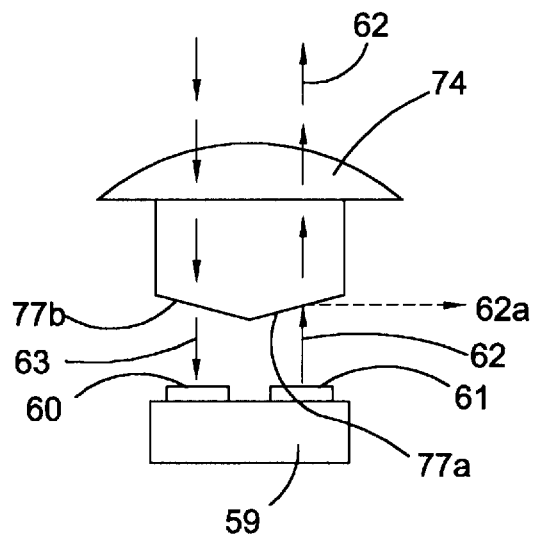
FIG. 8 shows a window element for use with the reflective switch of the present invention. The window element is adapted to minimize unwanted internal reflections by means of at least one angled beam input surface.

FIG. 8 shows window element 74 with angled beam input surface 77a arranged to minimize unwanted internal reflections from interacting with photodetector 60 in sensor 59. Light rays 62 from light emitter 61 are incident on angled surface 77a. A small percentage of these incident rays are internally reflected and are directed by angled surface 77a along path 62a away from photodetector 60. The remaining light rays from emitter 61 pass through window 74 and are available for external reflection, whereupon they are returned to photodetector 60 along path 63. Surface 77b need not be angled, however, doing so makes window element 74 symmetrical and thereby aids in the assembly thereof.

It has been discovered that if the sensor windows 72 or 74 are raised and given at least one convex surface to form a lens as shown, then light emitted from LED 60 is condensed and focused externally, and after it reflects from a user's digit 70 or some other object, this lens acts to collect and concentrate the reflected light into the photo electric receiver 61 in reflective switch element 59. In this manner, operation is further enhanced in that the device has greater sensitivity over distance and less light is needed to effect system actuation, thereby reducing current requirements for operation.

Figure 3C:
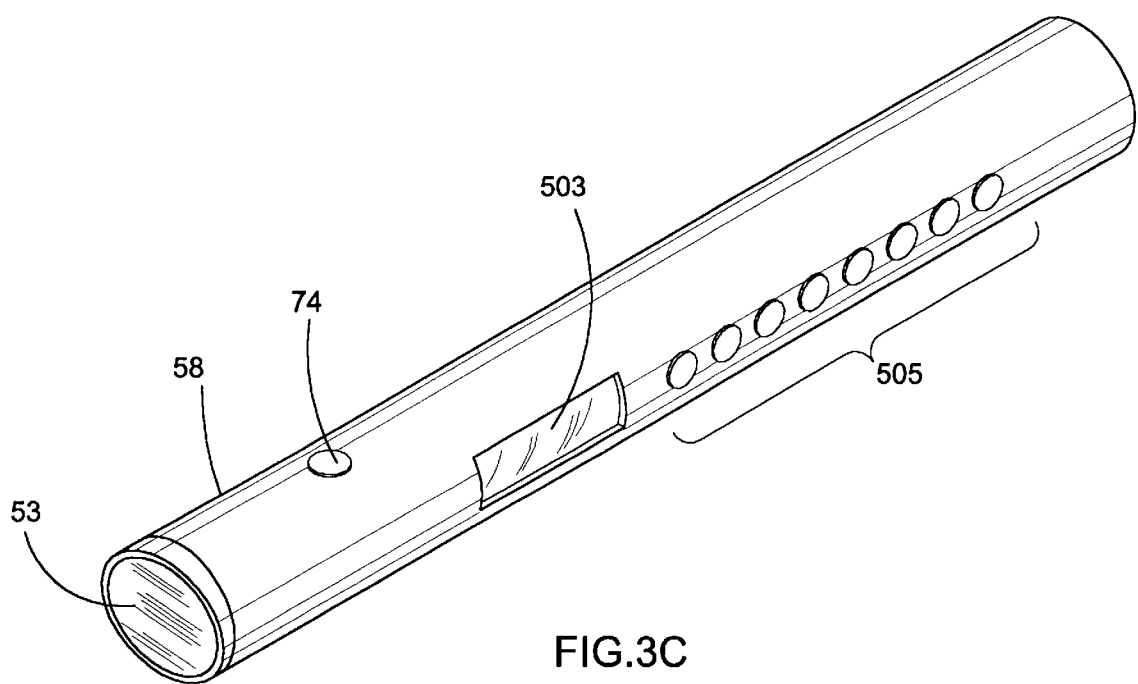
FIG. 3C illustrates an alternative embodiment of the scan system shown in FIG. 3.

FIGS. 3, 3A and 3B illustrate a further embodiment of the present invention wherein a user may actuate the scan system by sliding the user's thumb 75 (shown also in a phantom view as thumb 75a) over a reflective switch element 59 disposed within the system housing 58. FIG. 3C illustrates how a small data entry keyboard 505 and display 503 may be added for entering and displaying information into the scan system.

Figure 9:
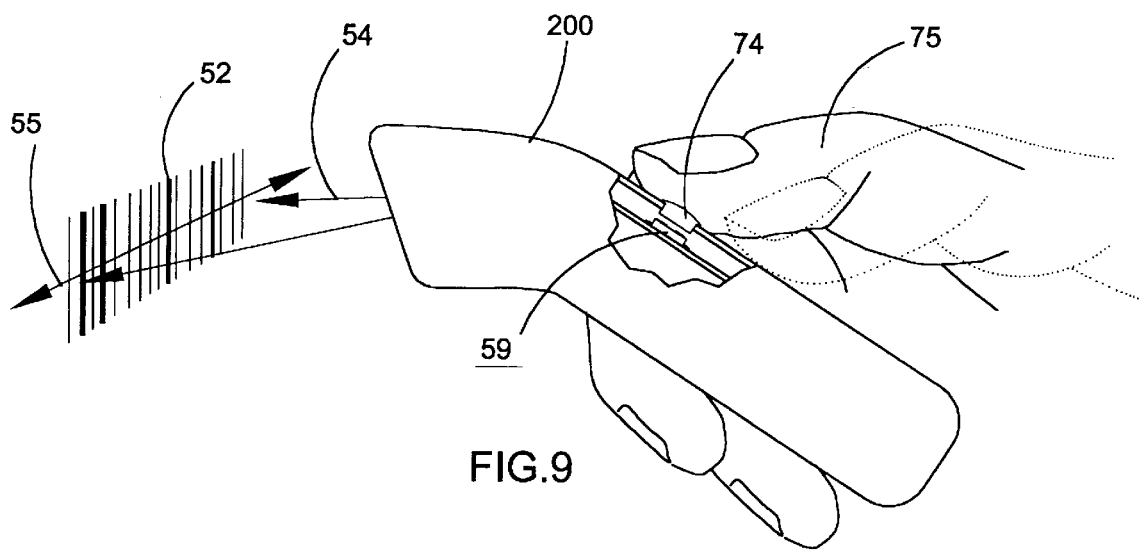
FIG. 9 shows another embodiment of a scan system in accordance with the present invention. The scan system in FIG. 9 has a shape somewhat like a small electric shaver and a thumb actuated reflective switch.
Figure 9A:
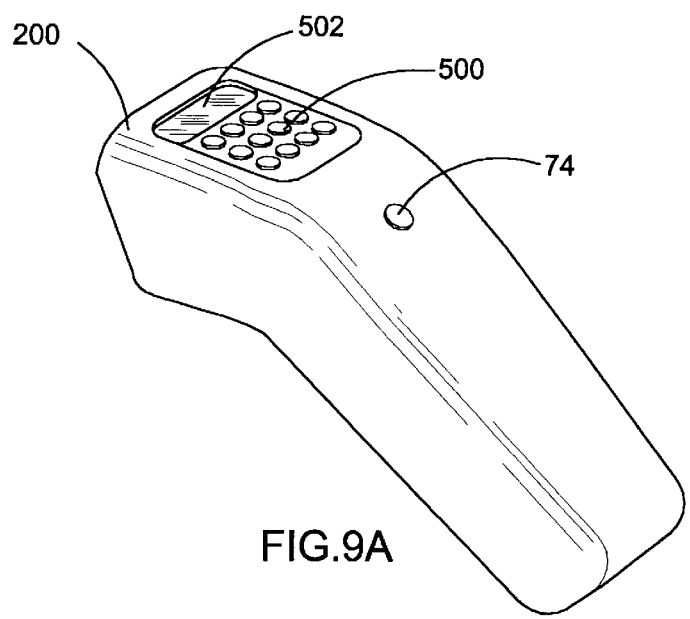
FIG. 9A illustrates another embodiment of the scan system shown in FIG. 9.
Figure 10:
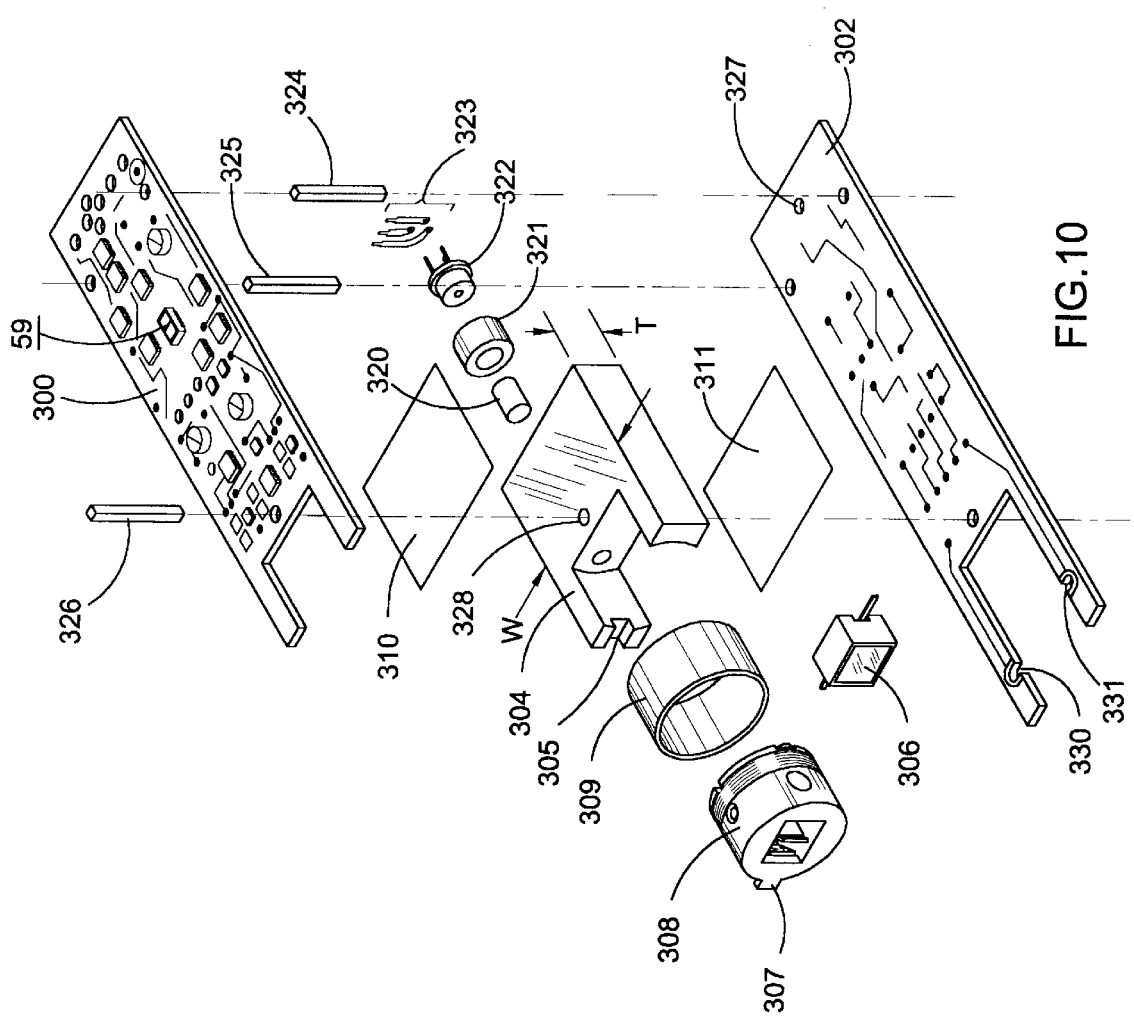
FIG. 10 is an isometric exploded view of components of a miniature scan head small enough to be worn on a person's finger. The miniature scan head includes the components for implementing a reflective switch in accordance with the present invention.

FIG. 9 illustrates how a reflective switch element 59 may be installed in housing 200 shaped like a shaver for actuation of a hand holdable laser scanner. Such a sensor may be positioned for finger or thumb actuation. A scan head such as the one depicted in FIG. 10 is installed in the front of the device. The shape of scanner housing 200 makes it readily adaptable for incorporation of micro-processor based information processing circuitry because of its volume and shape. A single contoured circuit board in the housing 200 having roughly the outline of housing 200 could carry such circuits. Also, as shown in FIG. 9A, a small data entry keyboard 500 and display 502 may be added for entering and displaying information into the scan system.

Miniaturized Wearable Scan Module

FIG. 10 is an exploded view of a miniature scan system small enough to be worn on a person's finger, according to the present invention. The miniature scan system incorporates a reflective switch element 59 on circuit board 300. This scan system was assembled onto a chassis 304 having width W of only one half inch, a thickness T on the order of only one quarter inch, and a length of approximately one half inch. It is small enough to be housed in finger mountable housing 91 of FIG. 5. With its small size and low mass, it may be mounted on a finger ring or attached to the finger with a small strap 92 which may be wrapped around the housing 91 or it may be attached to a ring or worn like a wristwatch. Alternatively, the scan system may be affixed temporarily to a glove with Velcro, a button on, a snap on device or the like. (It is possible to build this scan system to even smaller proportions, but a non-standard laser housing would have to be used.)

The modular scan system of FIG. 10 is uniquely and compactly packaged as follows. Lens 320 is cemented into chassis block 304. Laser 322 is bonded into ferrule 321 so the laser/ferrule assembly may slide into a receptive hole in the rear of block 304 as a unit like a piston for precision focusing. The laser/ferrule combination is focused with respect to lens 320 by sliding it to a desired beam focus position, and then glued into block 304. Scan element 308 (various embodiments of scan element 308 shown in more detail in FIGS. 12A, 12B, 13A, 13B, 13C) slides into ferrule 309 which in turn is mounted by sliding it into the front of block 304. Scan element 308 has tab 307 which is received by notch 305 in block 304 to orient scan element 308. Thus, when laser 321 is energized along with scan element 308, a scanning beam emerges from element 308. Power to laser 322 is delivered by flexible leads 323 which are attached to circuit board 300. Boards 300 and/or 302 are attached to block 304 by pinning them together with pin 326 or by using a small screw or bonding with adhesive. Block 304 includes mounting hole 328.

Typically, circuit board 300 contains drive circuitry for powering laser 322 and scan element 308. If block 304 is metal, insulator 310 isolates block 304 from circuit board 300, but a plastic block 304 is also practical for intermittent operation of laser 322 and is much lighter. Photo electric converter assembly 306 consisting of a photo detector such as a photo diode and interference filter for detecting light from laser 322 and reflected from a target is mounted to the front of the system by attaching it to circuit board 302 in cut away holes 330 and 331. Alternately, photo detector assembly 306 may be located elsewhere on the body of the user as explained in connection with FIG. 5 below. Conductors 325 and 324 conduct power between circuit boards 300 and 302.

Figure 11:
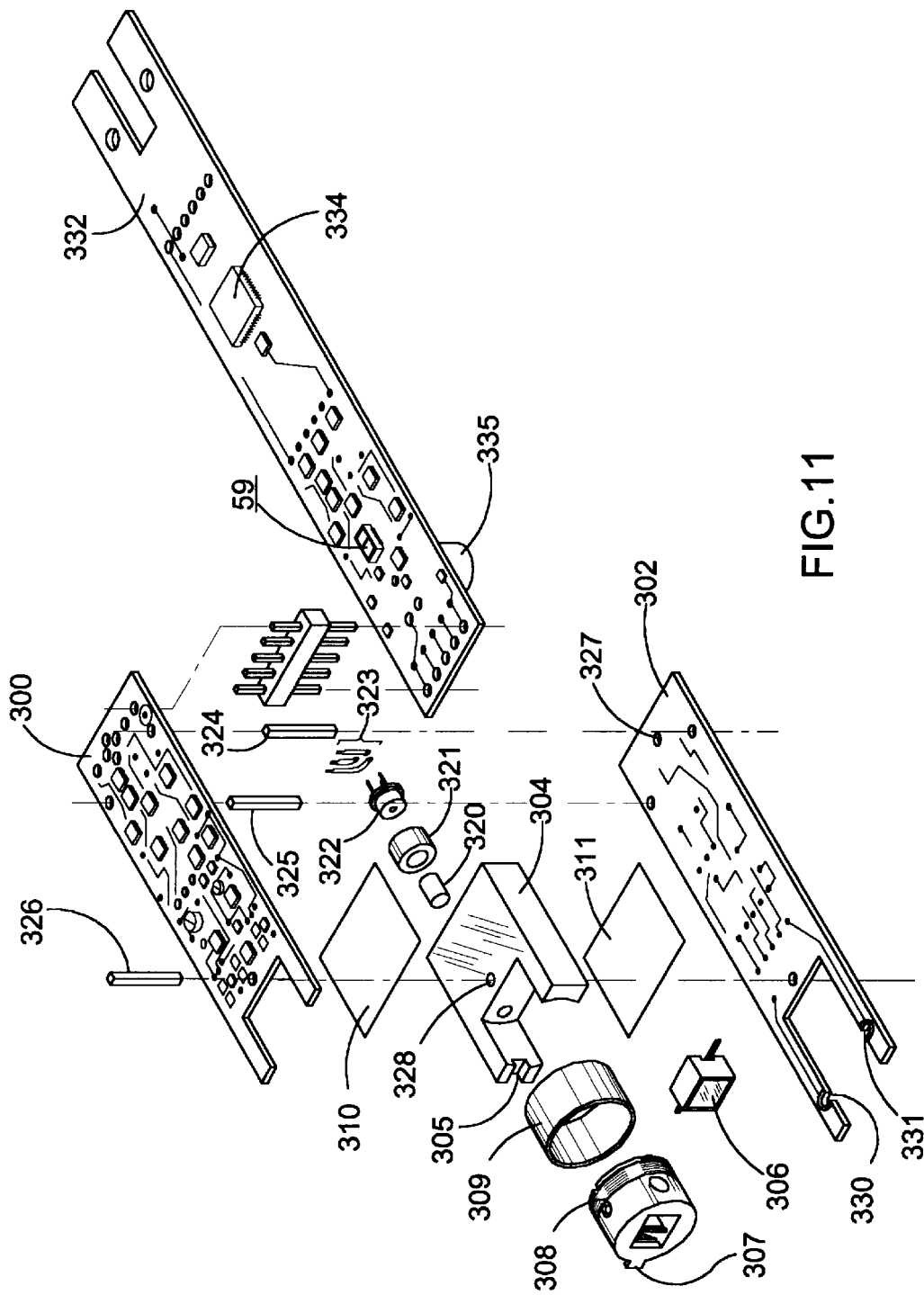
FIG. 11 is an isometric exploded view of the components of a scan system small enough to fit into a pen or wand. The scan system includes the components for implementing a reflective switch in accordance with the present invention.

The scan system shown in FIG. 11 is similar to that of FIG. 10 but is adapted to fit into a pen or wand housing 58 like the type shown in FIG. 1. The scan system in FIG. 11 carries a reflective switch element 59 on circuit board 332 for actuating the scan system as previously described. Another convenient method of actuating the scan system of FIG. 11 is an acoustic activating method. In this embodiment, the user merely taps the housing of the scan system. The tap produces an internal sound inside the housing and is sensed by microphone element 335. The kind of microphone elements used in small lapel type microphones or toys are suitable. Such microphone elements typically cost less than a dollar and require very little power to operate continuously. When operated with a low power CMOS amplifier and comparator threshold circuit, the microphone turns the scan system on and the scan system may be controlled by a time out circuit or turned off by a decoder operatively attached to the scan system. A decode IC such as decode chip 334 may also be included in the scan system of FIG. 11 and is suitably housed within pen style housing 58 of FIG. 1. The Hewlett Packard Company among others sells such decode integrated circuits.

In any of the embodiments of the present invention any of the above described actuation means may be used alone or in combination and, of course, a simple low cost mechanical switch such as are used in a computer mouse or the like may be incorporated when the ergonomic benefit of a non-mechanical switch is not required.

Extremely Low Power "One-Shot" Beam Scan Methods

Figure 5:
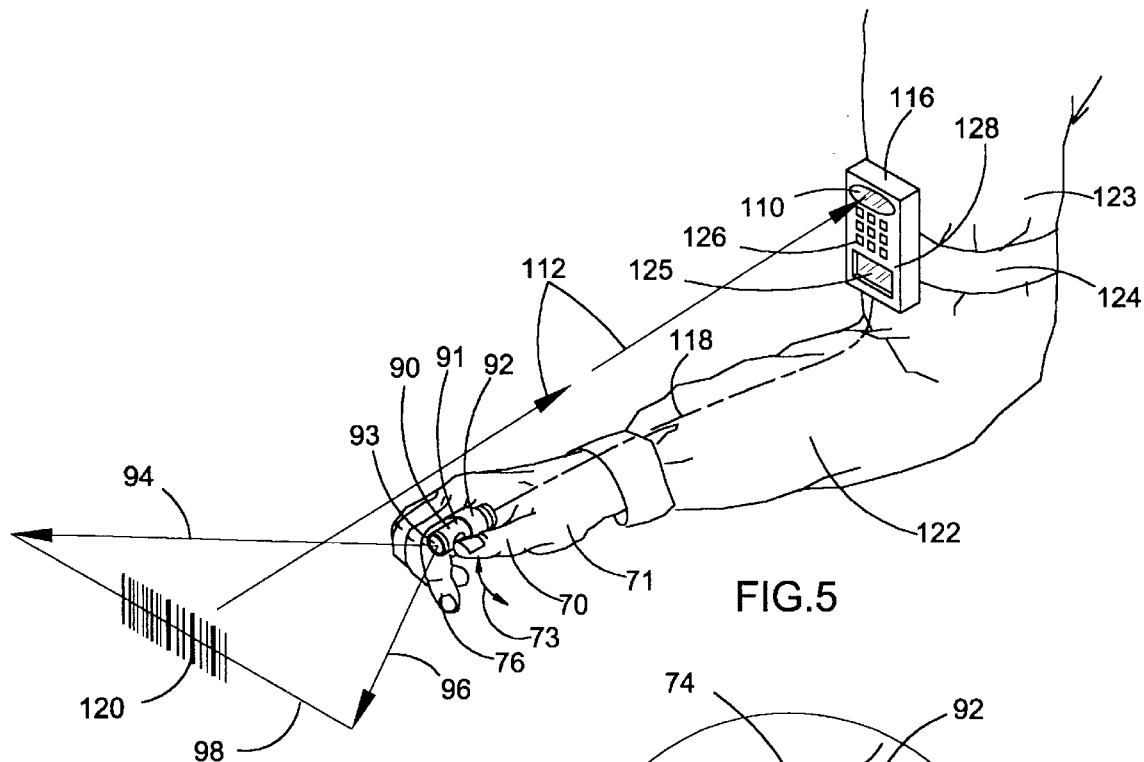
FIG. 5 illustrates a wearable scan system made from a light beam scanner and a separate data collection terminal, wherein there is no required cable connection between the scanner and data collection terminal, in accordance with a further alternative embodiment of the present invention. The light beam scanner preferably includes no components for receiving light reflected back from the target, and is wearable on the user's finger.

In portable equipment and especially in miniaturized and wearable scan systems which may only operate on a coin cell type battery, it is essential to conserve power. A "one-shot" beam scan system which reduces power requirements to a minimum is now disclosed. The "one-shot" beam scan system is ideal for use in wearable scanner 90 as depicted in FIG. 5 or hand-operable scanners as shown in FIGS. 1–4 and 9.

Figure 12A:
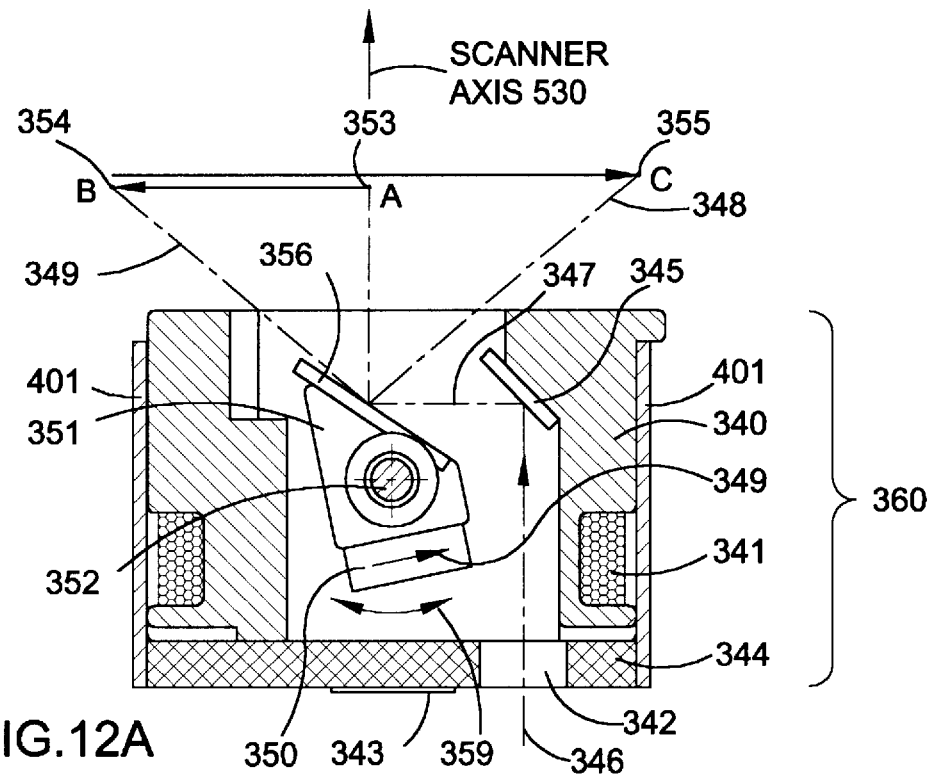
FIG. 12A is a cut away view of a scan element for producing a one-shot light beam scan in accordance with the present invention. In the one-shot scan shown in FIG. 12A, the light beam is initially stationary at a centered angular position and the beam initially moves from this stationary position to an angular position to the left of the centered position; thereafter the light beam scans to an angular position to the right of the centered position, and finally, the light beam moves back to the centered position and stops. The right and left angular positions represent the extreme ends of a scan line.

Turning to FIG. 12A, there is shown a scan element of the kind typically used in the present invention. This type of scan element is called an axial™ scan element and is disclosed in U.S. Pat. No. 5,596,446 and also in U.S. Pat. No. 5,596,442, both awarded to the instant inventor, and incorporated herein in their entirety by reference. The scan element consists of a bobbin type frame 340 with coil winding 341, fixed mirror 345, and movable mount 351 rotatably mounted on shaft 352. Permanent magnet 350 (having a direction of polarity illustrated by arrow 349) is attached to mount 351 as well as mirror 356. Alternating current applied to coil 341 will interact with the field produced by magnet 350 causing mount 351 to rotatably pivot about the axis of shaft 351 as indicated by double arrow 359. Movable mirror 356 attached to mount 351 will therefore move so as to scan a light beam introduced through hole 342 and traveling along path 346 and 347. Thus, the output light beam produced by scan element 360 will travel in generally the same direction as the input light beam supplied to scan element 360 along path 346, but the output light beam will scan about the scanner axis 530.

A neutral equilibrium position of magnet 350 is established by ferromagnetic ferrule 401 surrounding frame 340. Magnet bias shim 343 made from thin ferromagnetic material can shift the equilibrium position of magnet 350 to adjust it from right to left or to center magnet 350 with respect to the axis 530 of frame 340. Once a desired equilibrium adjustment is made, shim 343 is glued in place.

The scan device shown in FIG. 12A may be operated in a oscillatory mode, wherein upon actuation of the device a light beam is repeatedly made to scan between points B and C many times during a single scanning period. However, in accordance with the present invention, the scan device shown in FIG. 12A may also be operated in a "one-shot" mode, wherein upon actuation of the device, a light beam is made to scan between points B and C only once during a single scanning period. At the end of the single or "one-shot" scan, the mount 351 shortly (i.e., after a brief settling time) returns to a resting or still position and the light beam is not made to scan again until the device is actuated again. This "one-shot" mode may be used to conserve power and may also be referred to as a pulsed mode. FIG. 12C is a timing diagram illustrating the operation of the scan system during a one-shot scan as illustrated in FIG. 12A. Referring to FIGS. 12A and 12C, upon actuation of the device in the "one-shot" mode, current is supplied to a laser which introduces light along path 346 and produces a beam of light that intersects center point A 353 with respect to scanner axis 530. Almost immediately thereafter, current is supplied to coil 341 in the form of a single pulse of current. The pulse of current to coil 341 causes the previously stationary movable mount 351 to scan the light beam from point A 353 to point B 354, and then from point B 354 to point C 355. (Points B and C correspond to extreme ends of a scan line.) Movement from point B 354 to C 355 occurs without power because magnet 350 causes mount 351 to return to and then overshoot to its central equilibrium position along axis 530. Thereafter, magnet 350 causes mount 351 to return from its overshot position at point C 355 to the initial position at point A 353. Thereafter, mount 351 will remain stationary at point A 353 until the device is actuated again. Preferably, the device is operated so that a bright spot of light will appear centered at point A 353 for approximately 5 milliseconds before the light beam is moved to point B 354 and finally to point C 355 whereupon the laser is timed to turn off. The brief stationery pulse of light appearing at point A 353 allows a user to know where the scanner in which the scan element 360 operates is aimed. In this mode of operation, an oscillator is not needed to drive scan element 360. Only one, single polarity pulse of current need be supplied to coil 341. A circuit for supplying such a pulse has few components and is constructed with a one shot pulse generator or monostable multi-vibrator circuit. The entire scan sequence will typically take 20 to 50 milliseconds.

Referring still to FIGS. 12A and 12C, upon initiation of a scan beginning at point A 353, a photo electric light detection circuit (not shown) is also turned on to detect light reflected from a target located within an angle of view encompassed by lines 349 and 348. The photo electric converter produces a signal received from the target which is fed into a fast attack peak detector circuit (also not shown). This peak detector circuit sets up an automatic gain control (AGC) amplifier (also not shown) during the time the light beam traverses the angular distance from point A 353 to point B 354. With the AGC set, a full scan of the target may be accomplished when the light beam moves from point B 354 to point C 355. Light is received from the target by the photo electric converter during the data acquisition period shown in FIG. 12C, and the received light is then processed to extract information contained in the target. A user may initiate the one-shot sequence described above with a simple momentary contact mechanical switch, an electronic switch, an acoustic switch or a reflective switch as described herein. The simple mechanical switch is the lowest cost actuation method.

Figure 12B:
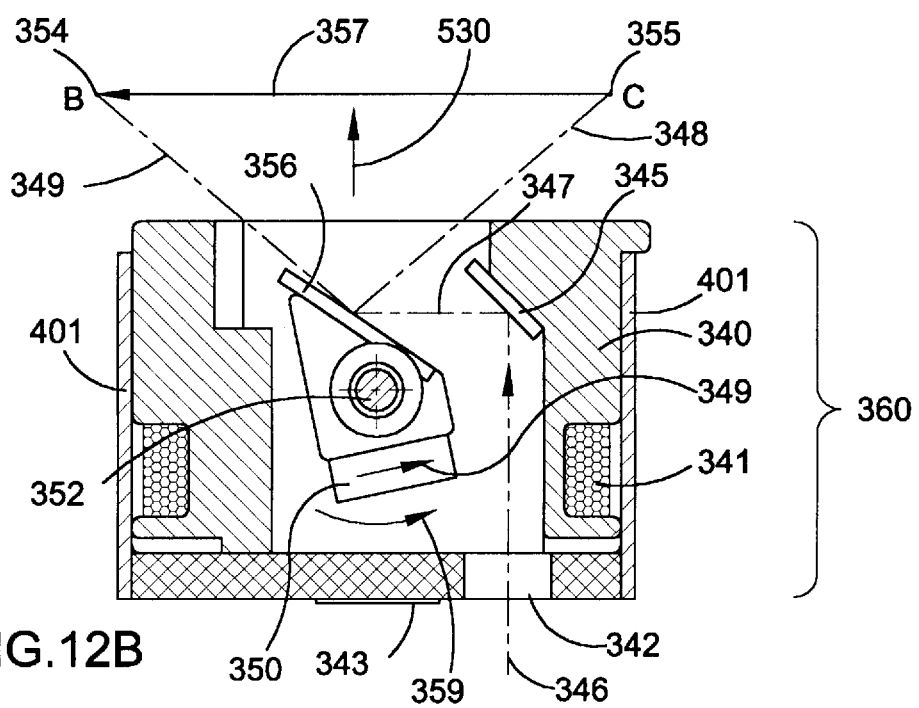
FIG. 12B illustrates a cut away view of a scan element for producing a single shot scan in accordance with an alternative preferred embodiment of the present invention. In the one shot scan shown in FIG. 12B, the light beam is initially positioned at one extreme of the scan line.
Figure 12C:
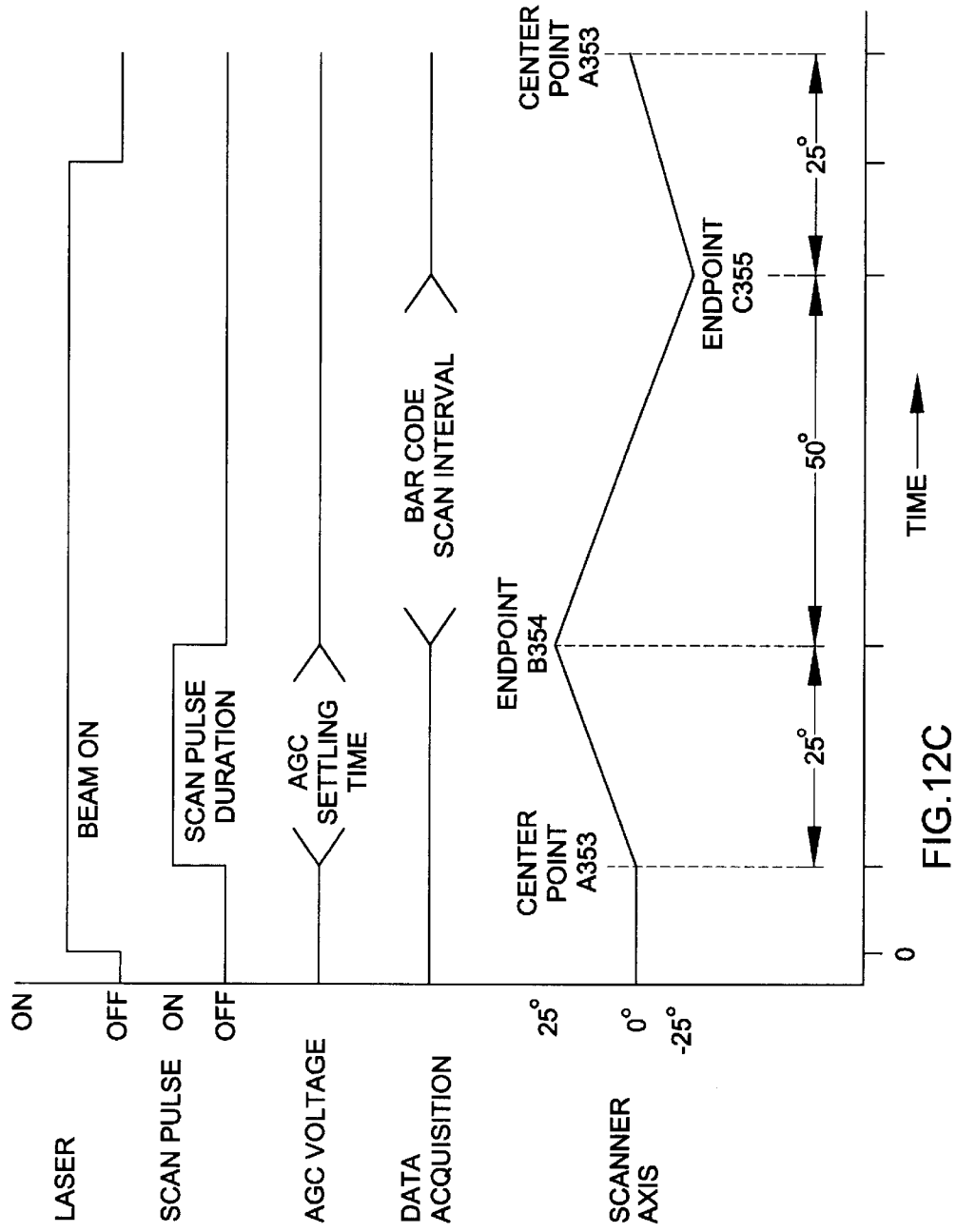
FIG. 12C is a timing diagram illustrating the operation of the components of a scan system during the one shot scan illustrated in FIG. 12A, in accordance with a preferred embodiment of the present invention.
Figure 12D:
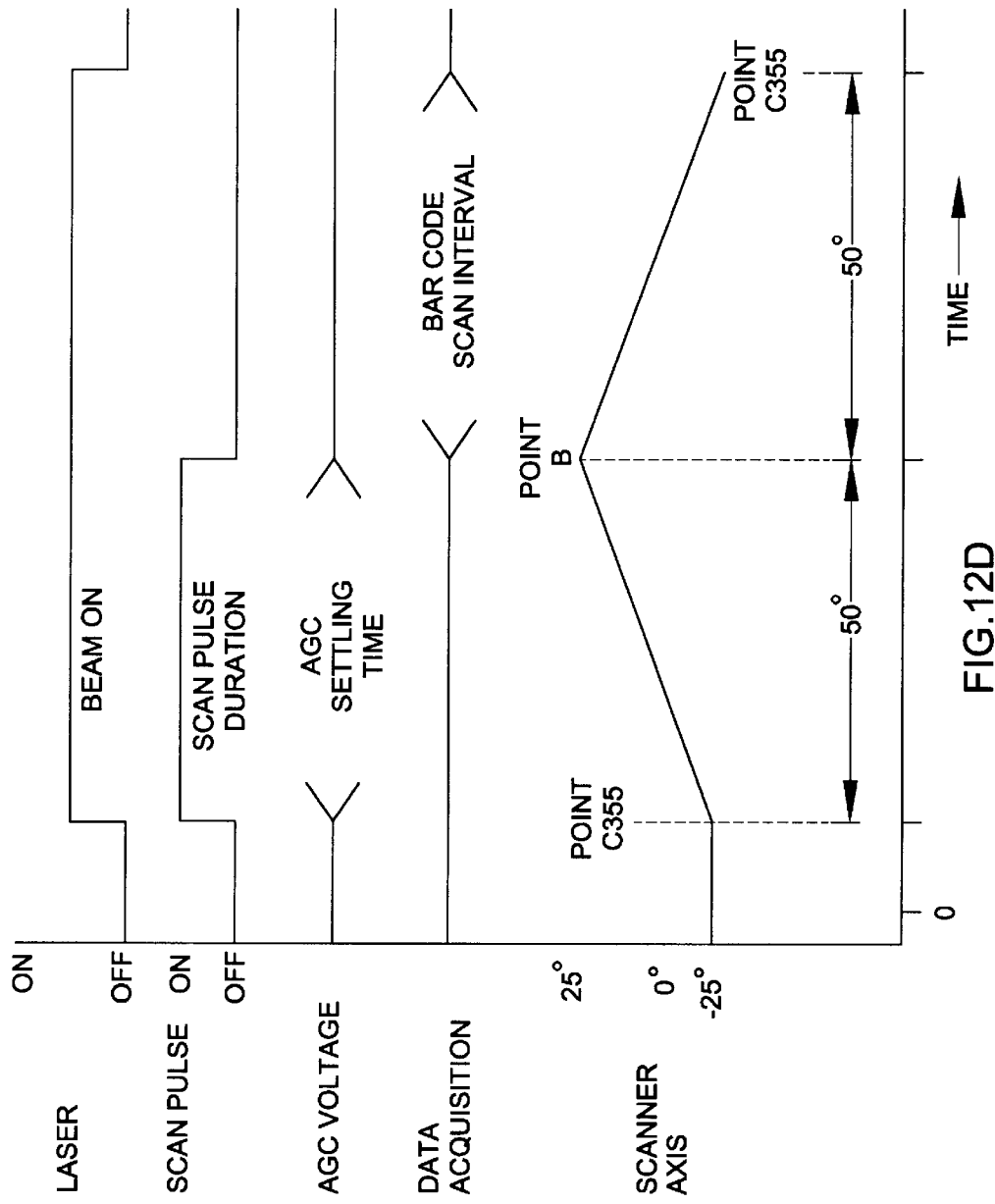
FIG. 12D is a timing diagram illustrating the operation of the components of a scan system during the one shot scan illustrated in FIG. 12B, in accordance with a further preferred embodiment of the present invention.

Referring now to FIGS. 12B and 12D, there is shown a second mode of operation of the one-shot scan sequence of the present invention. In the second mode of operation mount 351 is initially at a stationary equilibrium position at point B 354, and, upon initiation of the scan sequence, a pulse of current to coil 341 causes the light beam to scan from point B 354 to point C 355. Thereafter, the light beam moves back from point C 355 to point B 354 preferably without the application of current to coil 341 as described above. The scan interval may be initiated at point C 355 and ended at point B 354 as illustrated in FIG. 12B. In this case, the fast attack peak detector sets up an AGC circuit shortly after the beam moves from point C 355 before the target is actually encountered.

Figure 12E:
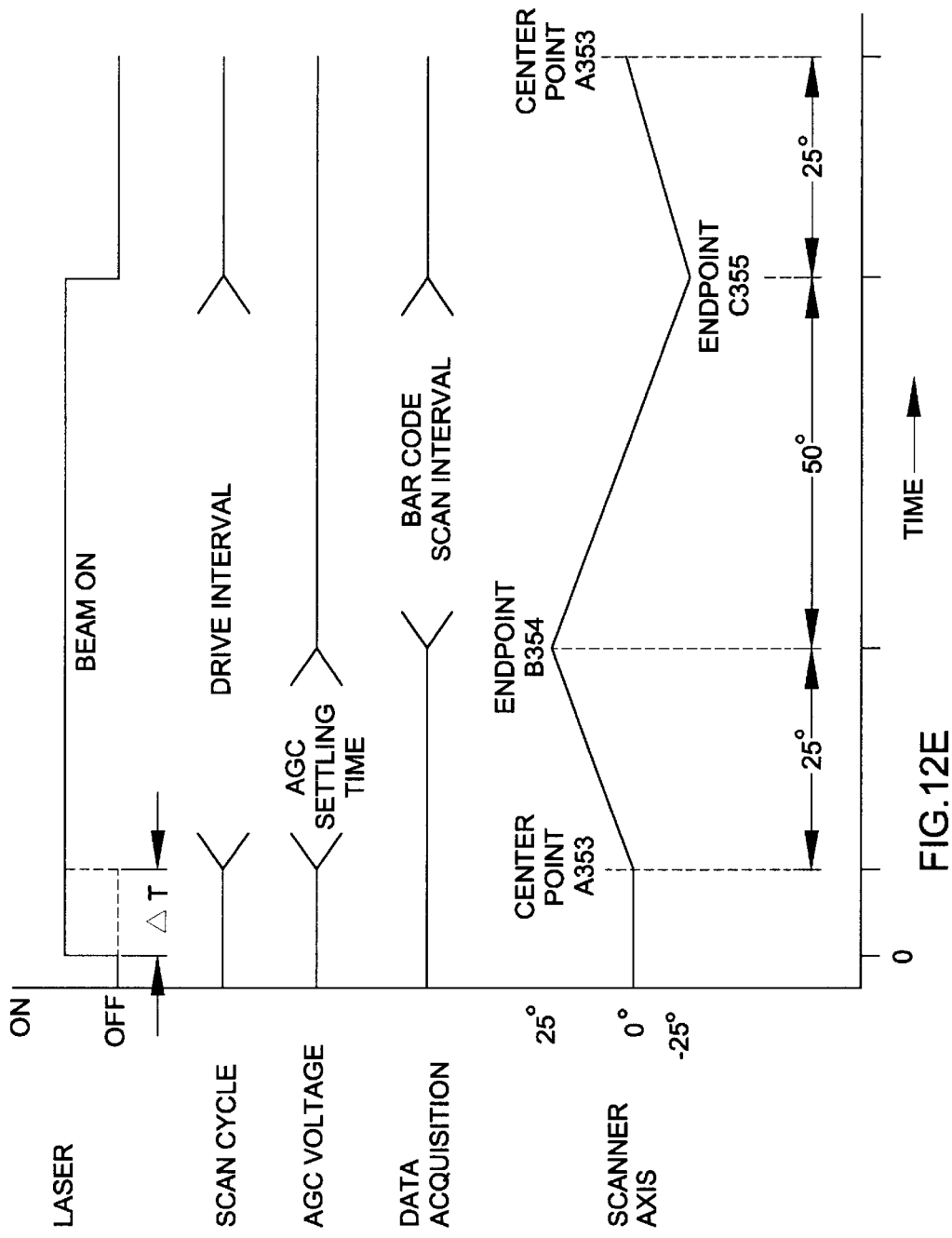
FIG. 12E is a timing diagram illustrating the operation of a scan system during a one shot scan wherein the laser is turned on for a brief period of time in order to produce an aiming spot before initiation of the one shot scan, in accordance with a further preferred embodiment of the present invention.

Referring now to FIG. 12E, there is shown a timing diagram of a further one-shot scanning sequence in accordance with the present invention. In the embodiment of FIG. 12E, the laser may be turned on for a brief interval )T before beginning to scan the beam so as to produce an aiming spot. (The aiming spot is optional.) Then during the drive interval, drive current is supplied to coil 341 of a scan element such as the one shown in FIG. 12A or 12B. During the drive interval one single polarity square wave pulse may be delivered to coil 341 of scan element 360 as previously described. However, a square wave pulse may also be delivered to coil 341 through a capacitor in series with coil 341. The square wave pulse can have a duration for most of the drive interval and the coil will receive a saw tooth wave form which delivers a positive then negative going current to the coil. This will produce a single sweep of mirror 356 as outlined for the FIGS. 12A or 12B, but rather than an impulse induced ballistic type sweep, mirror 356 will have a more uniform and controlled motion as it scans. Alternatively, during the drive interval of FIG. 12E, coil 341 may be energized with various wave forms, e.g., a short positive going and a short negative going square pulse, or a triangle, sinusoidal or other wave form that has one polarity then an opposite polarity. All have been effective for forming a one-shot scan as described herein. Indeed, it has been found that the inertia of the moving mount 351 with mirror 356 and magnet 350 has a filtering or smoothing effect on the sweep of a light beam reflected from moving mirror 356 when drive coil 341 is supplied with single non-repeating, non-oscillatory wave forms or pulses. The generation of such single non-repeating pulsed waveforms requires fewer components than are employed in traditional oscillators which are used for many cycles of repetitive beam sweeping.

It should be noted that the pulsed modes of operation described above are different from traditional oscillatory scan methods in that the scanned beam does not repetitively sweep back and forth across a target and power used in scanning is thereby kept to a minimum. If the pulsed scan is unsuccessful on one try the user may instantly reinitiate a new single scan having made an aiming adjustment from the first unsuccessful scan. (An audible beep is typically built into the scan system, or operatively connected to it, to signal a successful scan.) In this manner only two scans or three scans are required, each taking only tens of milliseconds and using very little power.

An additional benefit is derived from the pulsed mode scanner as it relates to safety and regulatory requirements imposed on the use of portable laser equipment. Since the pulse scan is so short in duration and is automatically terminated in only tens of milliseconds, the laser power may be increased without danger to a user so that distant targets are easily scanned at laser power levels greater than one milliwatt.

Rotating Axial Scan Method With Pulsed Mode Operation

Referring to FIGS. 13A, 13B and 13C, there is shown a miniature scan element 380 in accordance with a further preferred embodiment of the present invention. Scan element 380 is small enough to be disposed in a finger mounted housing such as housing 91 in FIG. 5. As explained below, scan element 380 is capable of high speed rotating scanning. Scan element 380 is formed of frame 340 around which coil 341 is wound and within which fixed mirror 345 is mounted. Also, fixedly mounted to frame 340 is shaft 352. Details of mounting arrangements for shaft 352 are omitted for clarity but typically consist of two holes on opposite sides of frame 340 wherein opposite ends of shaft 352 are captured. Frame 340 is preferably formed from a round plastic frame shaped like a coil bobbin, but may alternatively be oblong or rectangular. Rotor element 370 (also shown in a phantom view as rotor element 371) is rotatably mounted on shaft 352 so it may freely spin about a rotor axis with very low friction. Rotor element 370 is preferably made from plastic such as acetal having a very low coefficient of friction. Magnets 362 and 364 are bonded to rotor element 370, and mirrors 367, 366, 369 and 368 are also bonded to the outside surfaces of rotor element 370. Ferromagnetic strip 343 is bonded to non-magnetic base 344 which may be made from printed circuit board laminate. Hole 342 in base 344 allows a light beam to enter scan element 380 so that it may travel to mirror 345 as described for the scan element of FIG. 12A. One of magnets 362 or 364 will tend to attract to magnetic strip 343 thereby giving rotor element 370 an orientation such as is shown in FIG. 13B. This orientation aids in start up of scan element 380 by giving one of the magnets a favorable starting position with respect to the field produced in coil winding 341. A short DC current pulse introduced into coil 341 will act upon magnets 362 and 364 to deliver a torque impulse to rotor element 370 so that it will spin in a direction indicated by arrows 360 and 360A. The rotational inertia received from the current pulse will cause low friction rotor 370 to spin multiple times before stopping. A light beam reflected off mirror 345 will then encounter mirrors 366, 369, 368 and 367 as they spin with rotor element 370, thereby repetitively scanning a beam from point C 355 to point B 354 as long as the light source is on and element 370 spins. In this manner, consecutive scans are generated with only a short single pulse of current being required to effect scanning.

Scan element 380 may alternatively be operated in a continuous scan mode by supplying repetitive timed pulses to coil 341 or alternating current at an appropriate frequency. The size of scan element 380 or previously described scan element 360 may be very small. These devices have been constructed with a diameter of approximately 9 millimeters. Mirrors such as mirrors 366, 369, 368 and 367 are on the order of 2 mm wide and 3 mm long and 0.2 mm thick while mirror 345 is on the order of 1 mm square. In scan elements 360 and 380, the current pulse delivered to coil 341 need only be on the order of 3 volts with a duration of a several milliseconds and several milliamps of peak current. Of course, rotor element 370 need not be square, and only one magnet is needed and one rotating mirror is needed to operate. In the event that only one magnet is used, such as magnet 362, an appropriate mass may be substituted for magnet 364. Such mass may be either magnetic or non-magnetic and is preferably non-magnetic such as lead, brass or some other material, but by using non-magnetic material to balance rotor element 370 the efficiency of magnet 362 is not degraded.

Like scan element 360, the output light beam produced by scan element 380 will travel in generally the same direction as the input light beam supplied to scan element 380 along path 346, but the output light beam will scan about the scanner axis 530.

It should also be noted that ferromagnetic shim 343 is preferred but not absolutely necessary for successful operation of scan element 380. It merely aids in initially orienting one magnet, such as magnet 362, for maximum starting efficiency and is especially useful in the low energy pulse mode of operation. In a continuous mode of operation wherein alternating current is delivered to coil 341, this efficiency is useful for quick starting but not essential for continuous operation.

Ambient Light Elimination

In some applications external light such as sunlight or incandescent lighting contains wavelengths of light spanning a wide spectrum with a significant amount of light in the infrared band. This external light could undesirably affect the operation of the reflective switch of the present invention and even activate the switch when it is not desired to do so, especially when photo transistor 61 is wired to amplify low level reflected light signals from LED 60.

Figure 6A:
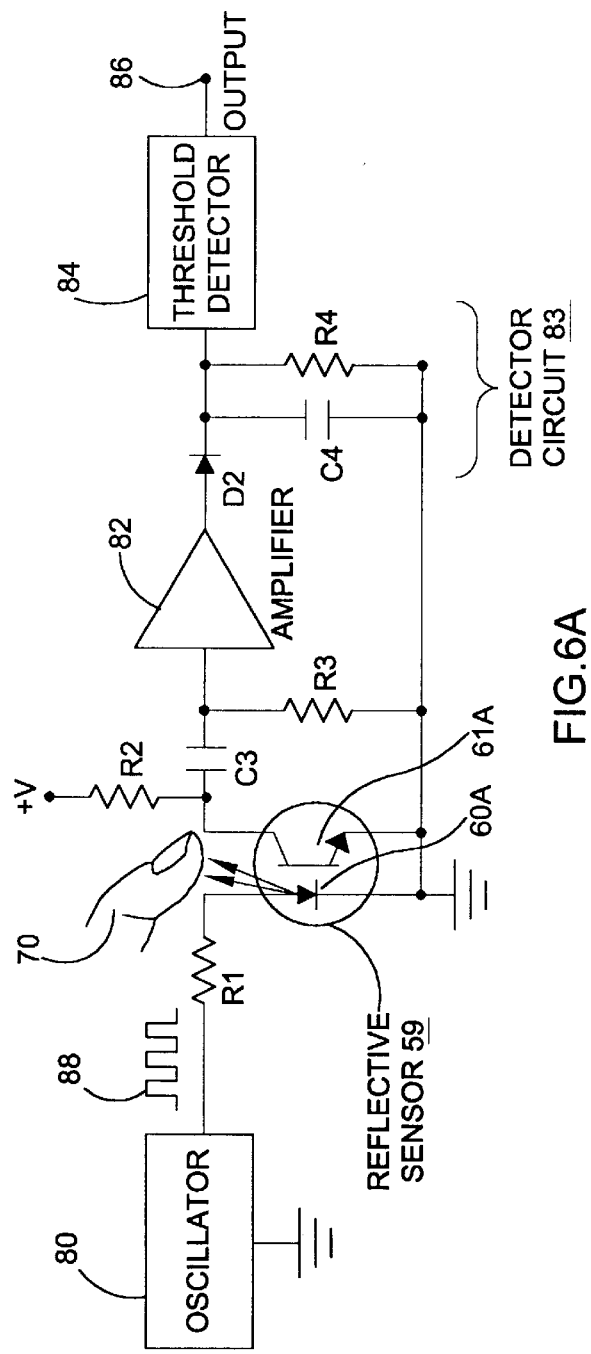
FIG. 6A illustrates a circuit which implements the reflective switch of the present invention in connection with the actuation of a scan system.

Referring now to FIG. 6A, there is shown a circuit for implementing the reflective switch of the present invention. The circuit illustrated in FIG. 6A prevents false actuation of reflective switch 59 and also saves power while the scanner is in a standby mode. During the stand by mode (scanner not activated by user) signal generator 80 produces a stream of pulses, preferably of low duty cycle on the order of 25% or less and typically a few volts in amplitude. (This low duty cycle provides substantial power savings in portable equipment.) Signal generator 80 may be a simple low power CMOS astable multi-vibrator which delivers current through a limiting resistor R1 to LED 60A of reflective switch 59. Alternatively signal generator 80 may be a pulse generator which produces many very short duration pulses per second. The frequency of the pulse train should be well above the flicker of ambient lighting and several kilohertz has been found sufficient.

When a user places his digit 70 near reflective sensor 59, photo transistor 61A receives weak light pulses emitted from LED 60A and reflected back by digit 70 and, by virtue of collector resistor R2, these pulses are amplified along with unwanted ambient light. A high pass filter consisting of R3 and C3 removes unwanted DC and unwanted low frequency signals from ambient light sources, whereas any high frequency light pulses from LED 60 are passed to and amplified by amplifier 82. Thus, when a user places his finger sufficiently close to element 59 as illustrated in FIGS. 1, 2, 3, or 9, amplifier 82 presents a stream of pulses to detector circuit 83 which typically consists of a diode D2, capacitor C4 and bleed resistor R4. A DC voltage from C4 and then triggers threshold detector 84 which changes the state of its output 86. This state change then is used to turn the scanner on. Threshold detector 84 may be an inverting or non-inverting Schmitt trigger, or similar buffer, depending on the polarity and drive requirement of the active output.

It should be pointed out that a user need not actually touch any portion of housing 58 as seen in FIG. 2, but only bring his digit 70 into close proximity of reflective switch 59 as shown by space 68.

Wearable Scan System

Figure 5A:
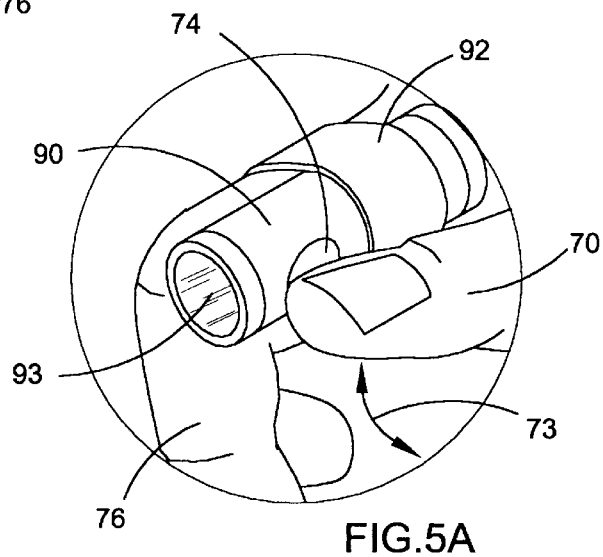
FIG. 5A is a magnified view of the light beam scanner shown in FIG. 5.

In some applications it has been found useful to make the sensitivity of the non-mechanical reflective switch 59 even greater than is required for the device depicted in FIG. 1A or FIG. 2. FIGS. 5 and 5A show a finger mountable scanner which is turned on by movement of the thumb over window 74 or simply relative movement of the digit upon which the scanner is mounted with respect to an adjacent digit. It is not necessary to actually touch any part of the housing of the scan device to actuate it. The sensitivity of reflective switch 59 is made great enough so that if the device is mounted on an index finger then movement of the thumb over window 74 is detected thereby turning on the scan function.

In another embodiment, the sensitivity of reflective switch 59 may be further enhanced by making it sensitive to an abrupt change in received light. This may be done by greatly amplifying the light signal received by reflective switch 59, electronically differentiating out slow changes in the received light signal, and then detecting and using the faster changes in the received light signal to electronically trip a threshold. These well known techniques are used in motion detectors and many variants are easily devised to those with basic electronic design skill. In this way, a user may actuate a wearable scan head such as that depicted in FIGS. 5 and 5A without actually touching but by simply moving digit 70 quickly.

Alternatively, a scan system such as that depicted in FIG. 1 may be placed in a high sensitivity mode and mounted fixedly, such as in a table top microphone style stand or the like. This adaptation makes the device even more versatile so that it may be operated in a point of sale application, for example, either by hand holding it or moving an object to be scanned past the device whereby motion of the object activates it. In this embodiment, no light source such as LED 60 need be employed as part of reflective switch 59; instead, the detector 61 in the reflective switch can be used to actuate the scan system simply in response to changes in the ambient light received by the detector.

Very Low Mass And Wireless Scanning

Figure 7:
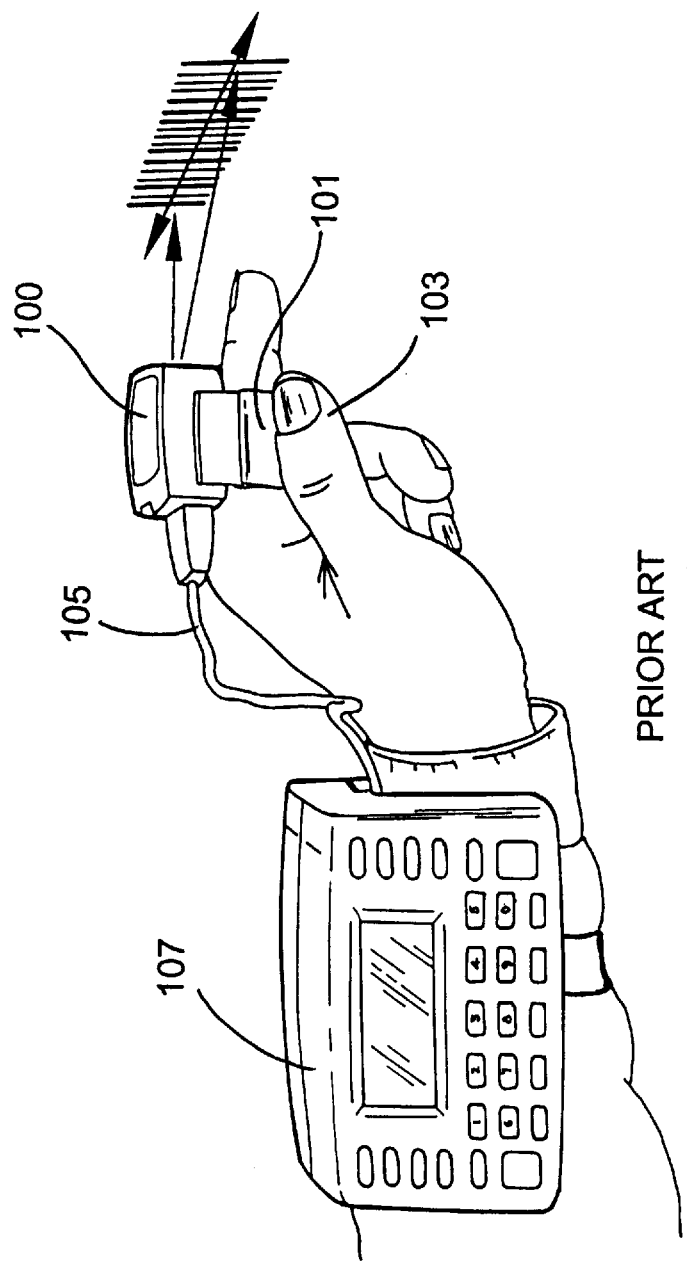
FIG. 7 illustrates a wearable prior art scan system operated by a bulky mechanical switch and requiring a cable connection between the scanning head and terminal.

The prior art scan system illustrated in FIG. 7 illustrates a bulky tethered finger mountable scan system 100 which requires the user to press lever 101 with a thumb 103 in order to actuate the system. Such thumb actuation is fatiguing and the lever can interfere with natural use of the hand and thumb. Furthermore, cable 105 attached to terminal 107 must be detached from scanner 100 if the user wishes to remove scanner 100, but then cable 105 will annoyingly dangle from the user's wrist.

Finger mountable scanner 90 of FIGS. 5 and 5A greatly reduces weight and fatigue and does away with the cable of prior art wearable scan systems. Thus, scan system 90 maximizes the portability and freedom of hand and finger movement for the user. (An attached cable can, however, be used with a finger mountable scanner and would be typically mounted to a user's arm as shown by dotted line 118.)

An embodiment of cableless scanner 90 is preferred and referred to hereafter as a "tetherless scanner." Tetherless scanner 90 is configured with a housing 91, a window 74 for transmitting light emitted from and reflected back to a reflective switch 59 disposed within housing 91, protective output window 93 for emitting a scanning light beam from housing 91, a mounting means 92 for attaching housing 91 to a user's finger, or other body part, an internal scan element as shown in FIGS. 10, 12A, 12B, 13A, 13B and 13C for scanning a light beam, an internal light source for generating the light beam, a power source such as a battery, and an actuation switch. To minimize fatigue, the switch is preferably a non-mechanical reflective switch mechanism as described for the scanner of FIGS. 1, 2, 3 and 9 and circuits of FIGS. 6A and 6B. (However, a mechanical switch, acoustic switch, capacitance sensing switch, motion sensing switch, eddy switch or frequency phase shift switch could alternatively be implemented.)

In a preferred embodiment, finger mountable tetherless scanner 90 has no internal photodetector for receiving light emitted from the internal scan element and reflected back from the target 120, nor does the scanner 90 contain digitizing electronics. In order to keep its mass and size to a minimum, it preferably contains only a laser light source, a beam focusing lens, a scan element for scanning beam 94, 96 (shown in extreme positions), an actuation switch (preferably a non-mechanical switch), circuitry for operating the scan element and light source, and a battery power source. A lithium power source is an ideal choice. Scanner 90 of FIG. 5 also has a transparent beam output window 93, a low mass housing 91, and a strap-on holder 92 for comfortably attaching it to a user's finger or wrist so it may be worn. The user preferably actuates scanner 91 by relative movement of a finger with respect to the thumb. This relative movement is illustrated by arrow 73 in FIGS. 5 and 5A. Actuation may be effected by a low cost mechanical switch or by a non-mechanical switch previously described.

When actuated, the laser in scanner 90 lights and the scan element moves beam 94 along a path 98 across target 120 such as a bar code to be read. As the beam spot traverses target 120, light is alternatively absorbed and reflected by the dark and light areas of the target. Reflected light from the target is reflected over a wide area as typified by a lambertion reflector. A portion of the reflected light travels along path 112 to a detector window 110 in terminal 128 which is preferably body mounted. No cable is needed between scanner 90 and detecting terminal 128.

Figure 6B:
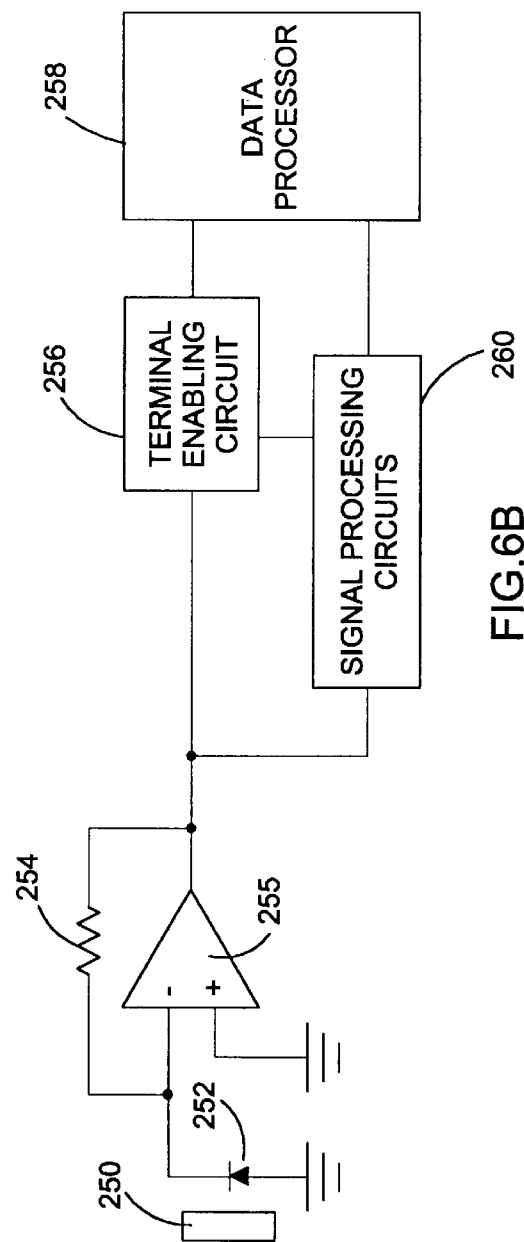
FIG. 6B illustrates a circuit for receiving light from a wearable scan head to effect operation of a remote data collection terminal, in accordance with the present invention.

If body mountable terminal 128 is conveniently attached by band 124 or Velcro or other means to a body part such as the user's forearm 122 or arm 123, then detector window 110 tracks the direction of finger mounted scanner 90. Circuitry for implementing terminal 128 is shown in FIG. 6B. Terminal 128 contains a low power photo detector 252 with an optical band pass filter 250 in front of it so it will pass light of the laser's particular wave length. The photo detector 252 is coupled to an amplifier circuit 254, 255. When scanning is initiated, the light detector 252 in terminal 128 senses this and actuates a terminal enabling circuit 256 (such as a high side P-MOS switching transistor) thereby turning on signal processing circuitry 260 such as digitizing and decode circuits as well as data processing and data memorizing circuitry 258 in terminal 128. It should be noted that the light detection circuitry may be mounted as an attachable module to terminal 128 or located at end 116 so it can be worn on the user's forearm as seen in FIG. 7.

Scan system 90 need only be turned on for a brief moment in order to execute a target scan, thereby enabling the completion of at least one complete date capture cycle, i.e., scan target, actuate terminal circuits and record scanned data in appropriate memory devices within terminal 128.

Terminal 128 ideally carries a display 125 such as a liquid crystal display and an auxiliary data entry key pad 126 for processing data to operate the terminal as a computing device and so on. In this way, data such as bar code data is gathered and processed conveniently and portably leaving the hands free for use.

In one embodiment it is contemplated that scanner 90 is actuated and repetitively scans target 120 until the data is successfully recorded by terminal 128 whereupon an audible beep emanates from terminal 128 indicating a successful data capture. The beep may be adapted to be sensed by a suitable acoustic detector such as a tiny microphone in scanner 90 to turn it off. Alternatively, terminal 128 may be configured to emit a flash from a light emitter such as a LED (not shown) located on it which is sensed by a detector in the back of scanner 90 thereby turning off scanner 90. Or, scanner 90 may be simply turned on briefly and timed out and the user is signaled of a successful scan by a flash or beep as previously explained.

It should be noted that an attached cable could be used with a finger mountable scanner and would be typically mounted to a user's arm as shown by dotted line 118. Also, for any of the scan system embodiments described herein, various actuation switches may be incorporated including mechanical, acoustic, capacitive, ambient power sensing proximity (e.g. 60 Hz), motion sensing, eddy killed, frequency phase shift/proximity or stress strain sensing switches.

Figure 5B:
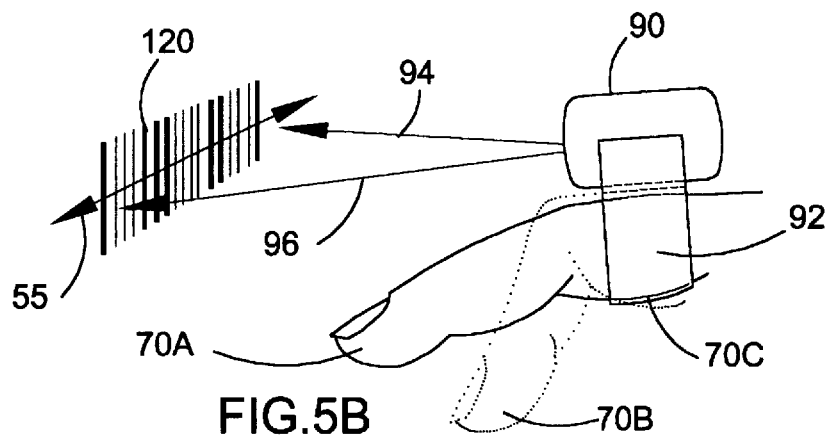
FIG. 5B and 5C illustrate an alternative embodiment of the light beam scanner shown in FIG. 5.
Figures 5C, 5D:
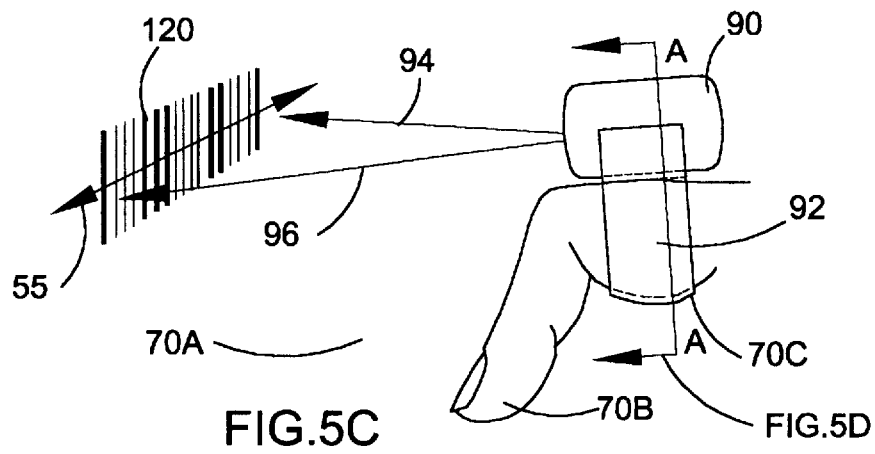
FIG. 5D illustrates a cross-sectional view of the finger-mounted light beam scanner shown in FIGS. 5B and 5C.
Figure 5D:
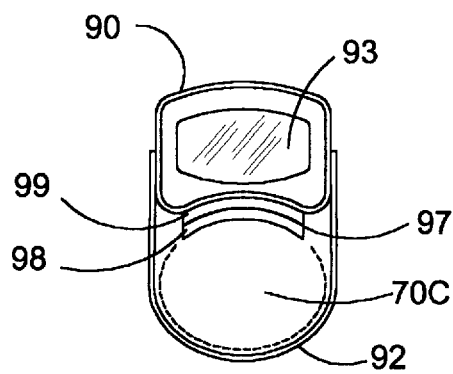

A particularly novel and convenient strain sensing switch mechanism appropriate for use on scanners, and particularly wearable scanners such as wrist or finger mountable scanners, is illustrated in FIGS. 5B, 5C and 5D. A strip 97 of metalized piezo electric material preferably plastic piezo electric film, such as PZT, but preferably, a flexible piezo element such as plastic piezo electric material, may be sandwiched in scan head mounting band 92 or under the scanner 90 proximate to the user's finger. Polyvinyl fluoride (PVF) is an example of a flexible plastic piezo material available in the form of film. Such PVF film is manufactured by AMP, Inc., Valley Forge, Pa. Strip 97 is also sandwiched between flexible layers 98 and 99 which are preferably padded flexible layers. The metalized sides of the PVF film 97 are then electrically connected to the input of a high impedance amplifier in scanner 90. A high impedance voltage amplifier, current to voltage converter or charge amplifier made from an FET input amplifier is ideal. Now when the user flexes a finger 70 (i.e., when the user moves finger 70 between position 70B and 70C), the muscles in finger 70 slightly deform the PVF film 97 causing it to deliver an electrical signal to the high impedance amplifier. The amplified signal is then used to electronically actuate wearable scanner 90. Alternatively, band 92 can be a wrist band so that scan head 90 may be worn like a watch and adapted for sensitivity to appropriate wrist flexing muscles. In an alternative embodiment, the piezo material may be sandwiched in a wearable band such as band 92 of FIG. 5. When the band is deformed due to flexing a scan head may be actuated in the manner described above.

Furthermore, it is to be understood that although the present invention has been described with reference to certain preferred embodiments, various modifications, known to those skilled in the art, may be made to the structures and process steps presented herein without departing from the invention as recited in the several claims appended hereto.

What is claimed is:

1. A non-mechanical switch for actuating a light beam scanning device disposed within a device housing, said device housing having a first area for emitting a scanning light beam from said device, comprising:

a reflective switch formed of a light source and a light detector disposed within said device housing, said light source emitting light through a second area on said device housing, said light detector being adapted to receive light emitted from said light source and reflected back through said second area toward said light detector by an object disposed outside of said device housing, said light detector having an output signal that is coupled by electronic circuitry to a light beam scanner within said light beam scanning device, said electronic circuitry being adapted to selectively actuate said light beam scanning device in response to said output signal from said light detector;

wherein said first area on said device housing for emitting said scanning light beam from said device is separate from said second area on said device housing.

2. The non-mechanical switch of claim 1, wherein said second area of said device housing is transparent to a wavelength of light emitted by said light source.

3. The non-mechanical switch of claim 2, said device housing having a third area separate from said first and second areas, wherein said third area attenuates said wavelength of light emitted by said light source.

4. The non-mechanical switch of claim 2, wherein said second area of said device housing attenuates light visible to a user of said light beam scanning device.

5. The non-mechanical switch of claim 2, wherein said wavelength of light emitted by said light source corresponds to infrared light.

6. The non-mechanical switch of claim 1, wherein said second area of said device housing is formed from a plug affixed to said housing, said plug being transparent to a wavelength of light emitted by said light source.

7. The non-mechanical switch of claim 6, wherein said plug has a convex outer shape.

8. The non-mechanical switch of claim 1, wherein said electronic circuitry includes an amplifier for amplifying said output signal from said light detector.

9. The non-mechanical switch of claim 8, wherein said electronic circuitry includes a filter for filtering out undesirable ambient light signals received by said light detector.

10. The non-mechanical switch of claim 1, wherein said object disposed outside of said device housing is a thumb of a user.

11. The non-mechanical switch of claim 1, wherein said object disposed outside of said device housing is a package which is proximate said device housing.

12. The non-mechanical switch of claim 1, wherein said housing is sealed with respect to an ambient environment.

13. The non-mechanical switch of claim 1, wherein said housing is formed in the shape of a pen or wand.

14. The non-mechanical switch of claim 1, wherein said housing is formed in the shape of a hand-operable housing or a finger-mountable housing.

15. The non-mechanical switch of claim 1, further comprising a display and a keyboard for receiving information in said light beam scanning device.

16. The non-mechanical switch of claim 1, wherein said light source is formed from a light emitting diode.

17. The non-mechanical switch of claim 1, wherein said light detector is formed from the group consisting of a photodetector, a photodiode, and a phototransistor.

18. The non-mechanical switch of claim 1, wherein said second area of said device housing is raised with respect to a third area of said device housing, said third area of said device housing being adjacent to said second area of said device housing.

19. The non-mechanical switch of claim 1, wherein said object disposed outside of said device housing is a finger of a user.

20. The non-mechanical switch of claim 1, further comprising a filter adapted to pass only signals corresponding to a wavelength of light emitted by said light source.

21. A non-mechanical switch for actuating a light beam scanning device disposed within a device housing, said device housing having a first area for emitting a scanning light beam from said device, comprising:

a reflective switch formed of a light detector disposed within said device housing, said light detector being adapted to receive light reflected through a second area on said device housing toward said light detector by an object disposed outside of said device housing, said light detector having an output signal that is coupled by electronic circuitry to a light beam scanner within said light beam scanning device, said electronic circuitry being adapted to selectively actuate said light beam scanning device in response to said output signal from said light detector;

wherein said first area on said device housing for emitting said scanning light beam from said device is separate from said second area on said device housing.

22. The non-mechanical switch of claim 21, wherein said second area of said device housing is formed from a plug affixed to said housing.

23. The non-mechanical switch of claim 22, wherein said plug has a convex outer shape.

24. The non-mechanical switch of claim 21, said device housing having a third area separate from said first and second areas, wherein said third area attenuates ambient light.

25. The non-mechanical switch of claim 21, wherein said object disposed outside of said device housing is a package which is proximate said device housing.

26. The non-mechanical switch of claim 21, wherein said housing is sealed with respect to an ambient environment.

27. The non-mechanical switch of claim 21, wherein said housing is formed in the shape of a pen or wand.

28. The non-mechanical switch of claim 21, wherein said housing is formed in the shape of a hand-operable housing or a finger-mountable housing.

29. The non-mechanical switch of claim 21, further comprising a display and a keyboard for receiving information in said light beam scanning device.

30. The non-mechanical switch of claim 21, wherein said light detector is formed from the group consisting of a photodetector, a photodiode, and a phototransistor.

31. The non-mechanical switch of claim 21, wherein said electronic circuitry includes an amplifier for amplifying said output signal from said light detector.

32. A method for actuating a light beam scanning device disposed within a device housing, said device housing having a first area for emitting a scanning light beam from said device, wherein a reflective switch formed of a light source and a light detector is disposed within said device housing, comprising the steps of:

emitting light with said light source through a second area on said device housing, wherein said first area on said device housing for emitting said scanning light beam from said device is separate from said second area on said device housing;

moving a finger or thumb about said second area on said device housing;

receiving, with said light detector, light emitted from said light source and reflected back through said second area toward said light detector by said finger or said thumb, said light detector producing an output signal that is coupled by electronic circuitry to a light beam scanner within said light beam scanning device; and selectively actuating said light beam scanning device in response to said output signal from said light detector.

33. The method of claim 32, wherein said second area of said device housing is transparent to a wavelength of light emitted by said light source.

34. The method of claim 33, said device housing having a third area separate from said first and second areas, wherein said third area attenuates said wavelength of light emitted by said light source.

35. The method of claim 33, wherein said second area of said device housing attenuates light visible to a user of said light beam scanning device.

36. The method of claim 33, wherein said wavelength of light emitted by said light source corresponds to infrared light.

37. The method of claim 32, wherein said second area of said device housing is formed from a plug affixed to said housing, said plug being transparent to a wavelength of light emitted by said light source.

38. The method of claim 37, wherein said plug has a convex outer shape.

39. The method of claim 32, wherein said electronic circuitry includes an amplifier for amplifying said output signal from said light detector.

40. The method of claim 39, wherein said electronic circuitry includes a filter for filtering out undesirable ambient light signals received by said light detector.

41. The method of claim 40, wherein said reflective switch is further formed from a filter adapted to pass only signals corresponding to a wavelength of light emitted by said light source.

42. The method of claim 32, wherein said housing is formed in the shape of a hand-operable or finger-mountable housing.

43. The method of claim 32, wherein said second area of said device housing is raised with respect to a third area of said device housing, said third area of said device housing being adjacent to said second area of said device housing.

44. The method of claim 32, wherein said housing is sealed with respect to an ambient environment.

45. The method of claim 32, wherein said housing is formed in the shape of a pen or wand.

46. The method of claim 32, wherein said finger or thumb is in contact with said second area of said device housing during said moving step.

47. The method of claim 32, wherein a space is present between said finger or thumb and said second area of said device housing during said moving step.

48. A method for actuating a light beam scanning device disposed within a device housing, said device housing having a first area for emitting a scanning light beam from said device, wherein a reflective switch formed of a light detector is disposed within said device housing, comprising the steps of:

moving an object about a second area on said device housing, wherein said first area on said device housing for emitting said scanning light beam from said device is separate from said second area on said device housing;

receiving, with said light detector, light reflected back through said second area toward said light detector by said object, said light detector producing an output signal that is coupled by electronic circuitry to a light beam scanner within said light beam scanning device; and selectively actuating said light beam scanning device in response to said output signal from said light detector.

49. The method of claim 48, wherein said second area of said device housing is formed from a plug affixed to said housing.

50. The method of claim 49, wherein said plug has a convex outer shape.

51. The method of claim 48, said device housing having a third area separate from said first and second areas, wherein said third area attenuates ambient light.

52. The method of claim 48, wherein said object is a package which is proximate said device housing.

53. The method of claim 48, wherein said housing is sealed with respect to an ambient environment.

54. The method of claim 48, wherein said housing is formed in the shape of a pen or wand.

55. The method of claim 48, wherein said housing is formed in the shape of a hand-operable housing or a finger-mountable housing.

56. The method of claim 48, wherein said object is in contact with said second area of said device housing during said moving step.

57. The method of claim 48, wherein a space a present between said object and said second area of said device housing during said moving step.

* * * * *